United States Patent
Yamazaki et al.

(10) Patent No.: US 9,324,877 B2
(45) Date of Patent: Apr. 26, 2016

(54) SEMICONDUCTOR DEVICE, POWER DIODE, AND RECTIFIER

(71) Applicant: Semiconductor Energy Laboratory Co., Ltd., Atsugi-shi, Kanagawa-ken (JP)

(72) Inventors: Shunpei Yamazaki, Setagaya (JP); Hiromichi Godo, Isehara (JP); Satoshi Kobayashi, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 14/483,685

(22) Filed: Sep. 11, 2014

(65) Prior Publication Data

US 2014/0374756 A1    Dec. 25, 2014

Related U.S. Application Data

(63) Continuation of application No. 13/220,992, filed on Aug. 30, 2011, now Pat. No. 8,835,917.

(30) Foreign Application Priority Data

Sep. 13, 2010 (JP) ................................. 2010-204693

(51) Int. Cl.
*H01L 29/786* (2006.01)
*H01L 29/24* (2006.01)

(52) U.S. Cl.
CPC ............ *H01L 29/7869* (2013.01); *H01L 29/24* (2013.01); *H01L 29/78648* (2013.01)

(58) Field of Classification Search
None
See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

EP    1737044AA    12/2006
EP    2226847 A    9/2010
(Continued)

OTHER PUBLICATIONS

Taiwanese Office Action (Application No. 100132419) Dated Aug. 13, 2015.

(Continued)

*Primary Examiner* — Yasser A Abdelaziez
(74) *Attorney, Agent, or Firm* — Robinson Intellectual Property Law Office; Eric J. Robinson

(57) ABSTRACT

An object is to provide a semiconductor device having electrical characteristics such as high withstand voltage, low reverse saturation current, and high on-state current. In particular, an object is to provide a power diode and a rectifier which include non-linear elements. An embodiment of the present invention is a semiconductor device including a first electrode, a gate insulating layer covering the first electrode, an oxide semiconductor layer in contact with the gate insulating layer and overlapping with the first electrode, a pair of second electrodes covering end portions of the oxide semiconductor layer, an insulating layer covering the pair of second electrodes and the oxide semiconductor layer, and a third electrode in contact with the insulating layer and between the pair of second electrodes. The pair of second electrodes are in contact with end surfaces of the oxide semiconductor layer.

24 Claims, 18 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,251 B2 | 6/2010 | Hoffman et al. |
| 7,732,819 B2 | 6/2010 | Akimoto et al. |
| 7,732,847 B2 | 6/2010 | Tanaka et al. |
| 7,994,500 B2 | 8/2011 | Kim et al. |
| 8,058,645 B2 | 11/2011 | Jeong et al. |
| 8,067,775 B2 | 11/2011 | Miyairi et al. |
| 8,148,779 B2 | 4/2012 | Jeong et al. |
| 8,164,152 B2 | 4/2012 | Lee et al. |
| 8,188,477 B2 | 5/2012 | Miyairi et al. |
| 8,188,480 B2 | 5/2012 | Itai |
| 8,202,365 B2 | 6/2012 | Umeda et al. |
| 8,203,143 B2 | 6/2012 | Imai |
| 8,203,144 B2 | 6/2012 | Hoffman et al. |
| 8,207,531 B2 | 6/2012 | Takahashi et al. |
| 8,373,237 B2 | 2/2013 | Park et al. |
| 8,513,661 B2 | 8/2013 | Takahashi et al. |
| 8,647,031 B2 | 2/2014 | Hoffman et al. |
| 8,907,348 B2 | 12/2014 | Miyairi et al. |
| 9,029,851 B2 | 5/2015 | Miyairi et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0199960 A1 | 9/2005 | Hoffman et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0206332 A1 | 8/2009 | Son et al. |
| 2009/0230004 A1 | 9/2009 | Bray et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0039602 A1 | 2/2010 | Yamazaki et al. |
| 2010/0051935 A1 | 3/2010 | Lee et al. |
| 2010/0065844 A1 | 3/2010 | Tokunaga |
| 2010/0084648 A1 | 4/2010 | Watanabe |
| 2010/0092800 A1 | 4/2010 | Itagaki et al. |
| 2010/0102313 A1 | 4/2010 | Miyairi et al. |
| 2010/0109002 A1 | 5/2010 | Itagaki et al. |
| 2010/0136743 A1 | 6/2010 | Akimoto et al. |
| 2010/0219411 A1 | 9/2010 | Hoffman et al. |
| 2010/0264403 A1 | 10/2010 | Sirringhaus et al. |
| 2010/0320458 A1 | 12/2010 | Umeda et al. |
| 2010/0320459 A1 | 12/2010 | Umeda et al. |
| 2011/0049509 A1 | 3/2011 | Takahashi et al. |
| 2011/0109351 A1 | 5/2011 | Yamazaki et al. |
| 2011/0127526 A1 | 6/2011 | Kawae et al. |
| 2011/0193083 A1 | 8/2011 | Kim et al. |
| 2012/0119205 A1 | 5/2012 | Taniguchi et al. |
| 2012/0205651 A1 | 8/2012 | Lee et al. |
| 2013/0299821 A1 | 11/2013 | Yamazaki |
| 2014/0170818 A1 | 6/2014 | Sirringhaus et al. |
| 2014/0246669 A1 | 9/2014 | Miyairi et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-026119 A | 1/2000 |
| JP | 2000-044236 A | 2/2000 |

(56) References Cited

FOREIGN PATENT DOCUMENTS

| | | |
|---|---|---|
| JP | 2000-133819 A | 5/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-167087 A | 7/2009 |
| JP | 2010-040815 A | 2/2010 |
| JP | 2010-123938 A | 6/2010 |
| JP | 2010-153828 A | 7/2010 |
| JP | 2010-177431 A | 8/2010 |
| WO | WO-2004/114391 | 12/2004 |
| WO | WO-2005/093850 | 10/2005 |
| WO | WO-2007/017689 | 2/2007 |
| WO | WO-2007/110940 | 10/2007 |
| WO | WO-2008/126879 | 10/2008 |
| WO | WO-2008/133345 | 11/2008 |
| WO | WO-2009/093722 | 7/2009 |
| WO | WO-2010/047217 | 4/2010 |
| WO | WO-2010/058746 | 5/2010 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment", Appl. Phys. Lett, (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m = 3, 4, and 5), $InGaO_3(ZnO)_3$, and $Ga_2O_3(ZnO)m$ (m = 7, 8, 9, and 16) in the $In_2O_3$—$ZnGa_2O_4$—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing M003 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RDID Systems", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:the "Blue Phase"", Physics Letters, Sep. 10, 1973, vol. 45A, No, 2, pp. 115-116.

Cho.D et al., "21.2:Al and Sn-Doped Zinc Indium Oxide Thin Film Transistors for AMOLED Back- Plane", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties". SID Digest '09 : SID International Symposium Digest of Technical Papers, May 31, 2009, pp. 983-985.

(56) References Cited

OTHER PUBLICATIONS

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide TFTs and Their Application for Large Size AMOLED", AM-FPD '08 Digest of Technical Papers. Jul. 2, 2008, pp. 275-278.

Park.S at al., "Challenge to Future Displays: Transparent AM-OLED Driven by Peald Grown ZnO TF", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Hirao.T et al., "Novel Top-Gate Zinc Oxide Thin-Film Transistors (ZNO TFTs) for AMLCDS", J. Soc. Inf. Display (Journal of the Society for Information Display), 2007, vol. 15 No. 1. pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT", SID Digest '09 : SID International Symposium Digest of Technical Papers May 31, 2009, pp. 1110-1112.

Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2008, pp. 284-287.

Miyasaka.M, "Suftla Flexible Microelectronics on Their Way to Business", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Appliodations", SID Digest '09 : SID International Symposium Digest of Technial Papers, May 31, 2009, pp. 578-581.

Asaoka.Y et al., "291:Polarizer-Free Reflective LCD Combined With Ultra Low-Power Driving Technology", SID Digest '09 : SID International Symposium Digest of Technical Papers, May 31, 2009, pp. 395-398.

Lee.H et al., "Current Status of, Challenges to, and Perspective View of AM-OLED", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stablized Liquid Crystalline Blue Phases for Display Application", SID Digest '07 : SID International Symposium Digest of Technical Papers, 2007, vol. 38, pp. 1737-1740.

Nakamura.M, "Synthesis of Homologous Compound with New Long-Period Structure", NIRIM Newsletter, Mar. 1, 1995, vol. 150, pp. 1-4.

Kikuchi.H et al., "Polymer-Stabilized Liquid Crystal Blue Phases", Nature Materials, Sep. 2, 2003, vol. 1, pp. 64-68.

Kimizuka.N et al., "Spinel,YbFe2O4, and Yb2Fe3O7 Types of Structures for Compounds in the In2O3 and Sc2O3—A2O3—Bo Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Janotti.A et al., "Oxygen Vacancies in ZnO", Appl. Phys. Lett. (Applied Physics Letters) , 2005, vol. 87, pp. 122102-1-122102-3.

Oba.F et al., "Defect energetics in ZnO: A hybrid Hartree-Fock density functional study", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor", Philosophical Magazine, 2001, vol. 81, No. 5, pp. 501-515.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays", IDW '08 : Proceedings of the 6th International Workshops, Dec. 3, 2008. pp. 581-584.

Kim.S et al., "High-Performance oxide thin film transistors passivated by various gas plasmas", 214th ECS Meeting, 2008, No. 2317, ECS.

Clark.S et al., "First Principles Methods Using CASTEP", Zeitschrift fur Kristallographie, 2005, vol. 220, pp. 567-570.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Oh.M et al., "Improving the Gate Stability of Zno Thin-Film Transistors With Aluminum Oxide Dielectric Layers", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator", Appl. Phys. Lett. (Applied Physics Letters) , Sep. 1, 2003, vol. 82, No. 9, p. 1755-1757.

Kamiya.T et al., "Carrier transport properties and electronic structures of amorphous oxide semiconductors: the present status", Solid State Physics, Sep. 1, 2009, vol. 44, No. 9, pp. 621-633, Agne Gijutsu Center.

300

FIG. 10A1
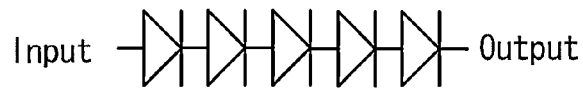
FIG. 10A2
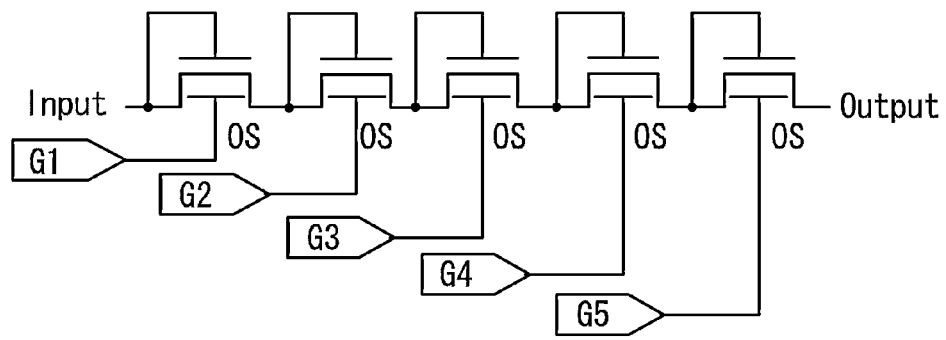
FIG. 10B1
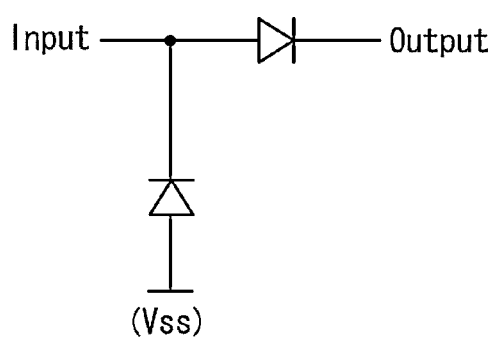
FIG. 10B2
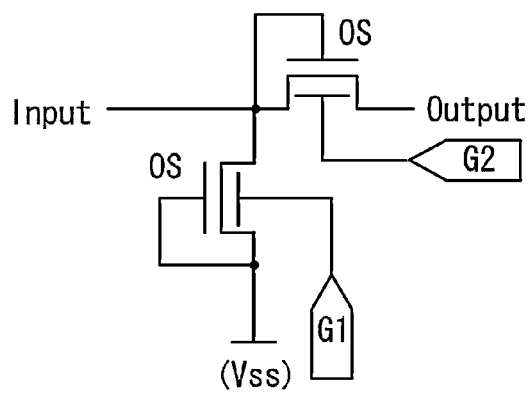
FIG. 10C1
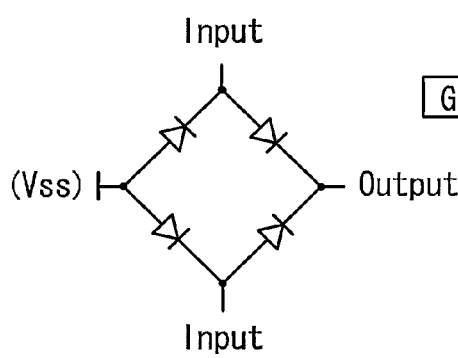
FIG. 10C2
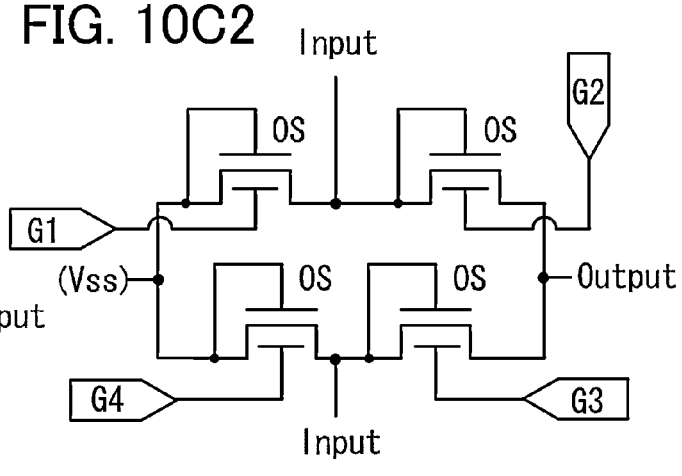

SEMICONDUCTOR DEVICE, POWER DIODE, AND RECTIFIER

BACKGROUND OF THE INVENTION

1. Field of the Invention

The technical field of the present invention relates to a semiconductor device using an oxide semiconductor.

In this specification, the semiconductor device refers to all the devices that operate by utilizing semiconductor characteristics. In this specification, a transistor is included in a non-linear element, the non-linear element is a semiconductor device, and an electrooptic device, a semiconductor circuit, and an electronic appliance including the non-linear element are all included in semiconductor devices.

2. Description of the Related Art

Many of transistors included in display devices typified by flat panel displays (e.g., liquid crystal display devices and light-emitting display devices) include silicon semiconductors such as amorphous silicon or polycrystalline silicon and are formed over glass substrates.

Attention has been directed to a technique by which, instead of such silicon semiconductors, metal oxides exhibiting semiconductor characteristics are used for transistors. Note that in this specification, a metal oxide exhibiting semiconductor characteristics is referred to as an oxide semiconductor.

As the oxide semiconductor, a single-component metal oxide such as tungsten oxide, tin oxide, indium oxide, or zinc oxide and an In—Ga—Zn-based oxide semiconductor which is a homologous compound are given. Techniques by which a transistor formed using the metal oxide is applied to a switching element of a pixel in a display device or the like have been already disclosed in Patent Documents 1 and 2.

As a semiconductor device formed using a silicon semiconductor, there is a semiconductor device for high power application, such as a field-effect transistor including metal and an oxide insulating film (a metal-oxide silicon field-effect transistor: MOSFET), a junction field-effect transistor (JFET), and a Schottky barrier diode.

In particular, silicon carbide (SiC), which is a silicon-based semiconductor material, is used in a Schottky barrier diode having small reverse saturation current and excellent withstand voltage characteristics (see Patent Document 3).

REFERENCE

Patent Document

[Patent Document 1] Japanese Published Patent Application No. 2007-123861
[Patent Document 2] Japanese Published Patent Application No. 2007-096055
[Patent Document 3] Japanese Published Patent Application No. 2000-133819

SUMMARY OF THE INVENTION

A semiconductor device for high power application needs various electrical characteristics such as high withstand voltage, low reverse saturation current, and high on-state current, but so many problems arise when a semiconductor device having such electrical characteristics is actually manufactured.

For example, silicon carbide has problems in that it is difficult to obtain a crystal with good quality and a process temperature for manufacturing a semiconductor device is high. For example, an ion implantation method is used to form an impurity region in silicon carbide; in that case, heat treatment at 1500° C. or higher is necessary in order to repair crystal defects caused by ion implantation.

In addition, since carbon is contained, there is a problem in that an insulating layer with good quality cannot be formed by thermal oxidation. Furthermore, silicon carbide is chemically very stable and is not easily etched by normal wet etching.

In addition, since the semiconductor device for high power application generates heat when a large current flows therethrough, a structure that allows thermal dissipation is needed for the semiconductor device for high power application.

Thus, in view of the above problems, an object of one embodiment of the present invention is to provide a semiconductor device having electrical characteristics such as high withstand voltage, low reverse saturation current, and high on-state current. In particular, an object of an embodiment of the present invention is to provide a power diode and a rectifier which include non-linear elements.

An embodiment of the present invention is a semiconductor device including a first electrode, a gate insulating layer covering the first electrode, an oxide semiconductor layer overlapping with the first electrode and in contact with the gate insulating layer, a pair of second electrodes covering end portions of the oxide semiconductor layer, an insulating layer covering the pair of second electrodes and the oxide semiconductor layer, and a third electrode in contact with the insulating layer and between the pair of second electrodes. The pair of second electrodes are in contact with end surfaces of the oxide semiconductor layer.

Note that in this specification, an end surface of the oxide semiconductor includes a top surface and a side surface in the case where a surface of the oxide semiconductor layer on the gate insulating layer side is referred to as a bottom surface. That is, a pair of second electrodes are in contact with the oxide semiconductor layer in a region except a channel formation region and a region in contact with a gate insulating layer. Therefore, the pair of second electrodes serve as a heat sink, and when heat is generated due to current flowing in the oxide semiconductor layer including the channel formation region, the pair of second electrodes can dissipate the heat to the outside.

Another embodiment of the present invention is in the above semiconductor device in which $n^+$ layers are provided between the gate insulating layer and the end portions of the oxide semiconductor layer, and the pair of second electrodes, in order to reduce contact resistance between the pair of second electrodes and the oxide semiconductor layer.

A depletion layer in the oxide semiconductor has a large thickness; therefore, in the semiconductor device, high on-state current can be obtained by increasing the thickness of the oxide semiconductor layer. In other words, another embodiment of the present invention is the semiconductor device in which the thickness of the oxide semiconductor layer is greater than or equal to 0.1 µm and less than or equal to 50 µm, preferably greater than or equal to 0.5 µm and less than or equal to 20 µm.

The oxide semiconductor layer may be a crystalline oxide semiconductor layer. With such a structure, a highly reliable semiconductor device in which variation in the electrical characteristics due to irradiation with visible light or ultraviolet light is suppressed can be achieved. The crystalline oxide semiconductor layer includes an oxide including a crystal with c-axis alignment (also referred to as C-Axis Aligned Crystal (CAAC)), which has neither a single crystal structure nor an amorphous structure. Note that part of the crystalline oxide semiconductor layer includes crystal grains.

In other words, another embodiment of the present invention is the above-described semiconductor device in which the oxide semiconductor layer is a crystalline oxide semiconductor layer, and the crystalline oxide semiconductor layer has an a-b plane parallel to a surface of the crystalline oxide semiconductor layer and has c-axis alignment in a direction perpendicular to the surface.

Another embodiment of the present invention is the above-described semiconductor device in which the crystalline oxide semiconductor layer includes one or both of zinc and indium.

Another embodiment of the present invention is the above-described semiconductor device in which the first electrode functions as a gate electrode, the pair of second electrodes function as a source electrode and a drain electrode, and the third electrode functions as a back gate electrode.

As the above-described semiconductor device, a power diode in which a plurality of non-linear elements are connected in series in the forward direction is given. In other words, another embodiment of the present invention is a power diode including a plurality of non-linear elements. The non-linear element includes a first electrode, a gate insulating layer covering the first electrode, an oxide semiconductor layer overlapping with the first electrode and in contact with the gate insulating layer, a pair of second electrodes in contact with the oxide semiconductor layer, an insulating layer covering the pair of second electrodes and the oxide semiconductor layer, and a third electrode in contact with the insulating layer and between the pair of second electrodes. The pair of second electrodes are in contact with end surfaces of the oxide semiconductor layer, one of the pair of second electrodes is in contact with the first electrode with the gate insulating layer provided therebetween, and the non-linear elements are connected in series in a forward direction.

As the above-described semiconductor device, a rectifier including two non-linear elements having the above-described structure is given. In other words, another embodiment of the present invention is a rectifier including a first non-linear element and a second non-linear element. The first non-linear element and the second non-linear element each include a first electrode, a gate insulating layer covering the first electrode, an oxide semiconductor layer overlapping with the first electrode and in contact with the gate insulating layer, a pair of second electrodes in contact with the oxide semiconductor layer, an insulating layer covering the pair of second electrodes and the oxide semiconductor layer, and third electrode in contact with the insulating layer and between the pair of second electrodes. The pair of second electrodes are in contact with end surfaces of the oxide semiconductor layer, one of the pair of second electrodes is in contact with the first electrode with the gate insulating layer provided therebetween, an anode of the first non-linear element is connected to a reference potential on a low potential side, a cathode of the first non-linear element is connected to an input portion and an anode of the second non-linear element, and a cathode of the second non-linear element is connected to an output portion.

Further, as the above-described semiconductor device, a rectifier including four non-linear elements having the above-described structure is given. In other words, another embodiment of the present invention is a rectifier including first to fourth non-linear elements. The first to fourth non-linear elements each includes first electrode, a gate insulating layer covering the first electrode, an oxide semiconductor layer overlapping with the first electrode and in contact with the gate insulating layer, a pair of second electrodes in contact with the oxide semiconductor layer, an insulating layer covering the pair of second electrodes and the oxide semiconductor layer, and a third electrode in contact with the insulating layer and between the pair of second electrodes. The pair of second electrodes are in contact with end surfaces of the oxide semiconductor layer, one of the pair of second electrodes is in contact with the first electrode with the gate insulating layer provided therebetween. An anode of the first non-linear element is connected to a reference potential on a low potential side and a cathode thereof is connected to a first input portion. An anode of the second non-linear element is connected to the first input portion and a cathode thereof is connected to an output portion. An anode of the third non-linear element is connected to a second input portion and a cathode thereof is connected to the output portion. An anode of the fourth non-linear element is connected to the reference potential on the low potential side and a cathode thereof is connected to the second input portion.

A semiconductor which has characteristics such as higher withstand voltage and lower reverse saturation current and can have higher on-state current as compared to a conventional semiconductor device can be provided. In addition, a semiconductor device in which degradation due to heat generation can be suppressed can be provided.

BRIEF DESCRIPTION OF THE DRAWINGS

In the accompanying drawings:

FIGS. 10A1 and 10A2, FIGS. 10B1 and 10B2, and FIGS. 10C1 to 10C2 illustrate power diodes and rectifiers that are embodiments of the present invention;

DETAILED DESCRIPTION OF THE INVENTION

Figure 1A:
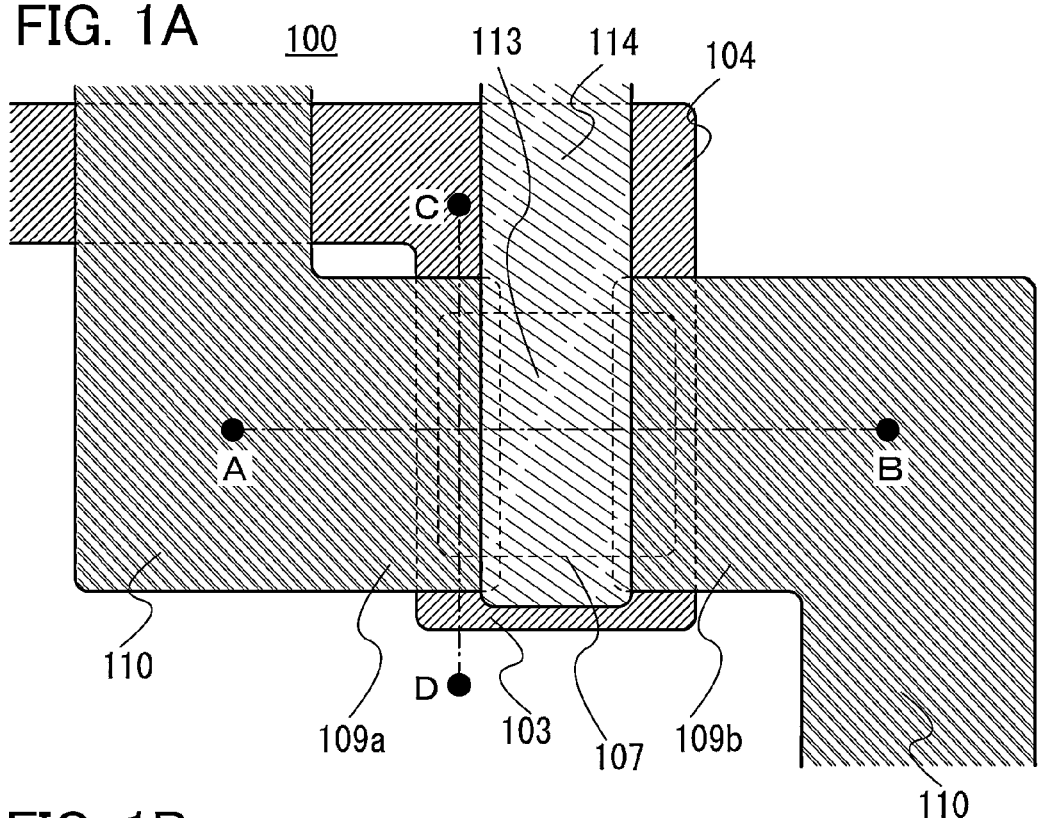
FIGS. 1A to 1C are a plan view and cross-sectional views illustrating a non-linear element that is one embodiment of the present invention.

Hereinafter, embodiments of the present invention will be described in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below. In describing structures of the present invention with reference to the drawings, the same reference numerals are used in common for the same portions in different drawings. The same hatching pattern is applied to similar parts, and the similar parts are not especially denoted by reference numerals in some cases. Note that the size, the layer thickness, or the region of each structure illustrated in each drawing is exaggerated for clarity in some cases. Therefore, the present invention is not necessarily limited to such scales illustrated in the drawings.

In an illustration of a stack of layers (or electrodes) included in a transistor, an end portion of a lower layer which protrudes from an end portion of an upper layer is not illustrated in some cases for convenience in a plan view of the transistor.

Further, when it is described that "A and B are connected to each other", the case where A and B are electrically connected to each other and the case where A and B are directly connected to each other are included. Here, each of A and B corresponds to an object (e.g., a device, an element, a circuit, a wiring, an electrode, a terminal, a conductive film, or a layer).

Note that a voltage refers to a difference between potentials of two points, and a potential refers to electrostatic energy (electric potential energy) of a unit charge at a given point in an electrostatic field. Note that in general, a difference between a potential of one point and a reference potential is merely called a potential or a voltage, and a potential and a voltage are used as synonymous words in many cases. Thus, in this specification, a potential may be rephrased as a voltage and a voltage may be rephrased as a potential unless otherwise specified.

Note that, functions of "source" and "drain" may become switched in the case that a direction of a current flow is changed during circuit operation, for example. Therefore, the terms "source" and "drain" can be used to denote the drain and the source, respectively, in this specification.

On-state current refers to a current (a drain current) which flows between a source electrode and a drain electrode when a transistor is on. For example, in the case of an n-channel transistor, on-state current refers to a drain current when a gate voltage of the transistor is higher than a threshold voltage of the transistor. Off-state current refers to a current (a drain current) which flows between a source electrode and a drain electrode when a transistor is off. For example, in an n-channel transistor, off-state current is a drain current when a gate voltage is lower than a threshold voltage of the transistor. Further, an on/off ratio refers to the ratio of on-state current to off-state current.

In this specification, an n-channel transistor whose the threshold voltage is positive is defined as a normally-off transistor, while a p-channel transistor whose threshold voltage is negative is defined as a normally-off transistor. Further, an n-channel transistor whose threshold voltage is negative is defined as a normally-on transistor, while a p-channel transistor whose threshold voltage is positive is defined as a normally-on transistor.

Embodiment 1

In this embodiment, a structure of a non-linear element that is one embodiment of the present invention and a method for manufacturing the non-linear element will be described with reference to FIGS. 1A to 1C, FIGS. 2A to 2D, and FIGS. 3A to 3D. Note that a transistor is described as an example in this embodiment.

Figure 1B:
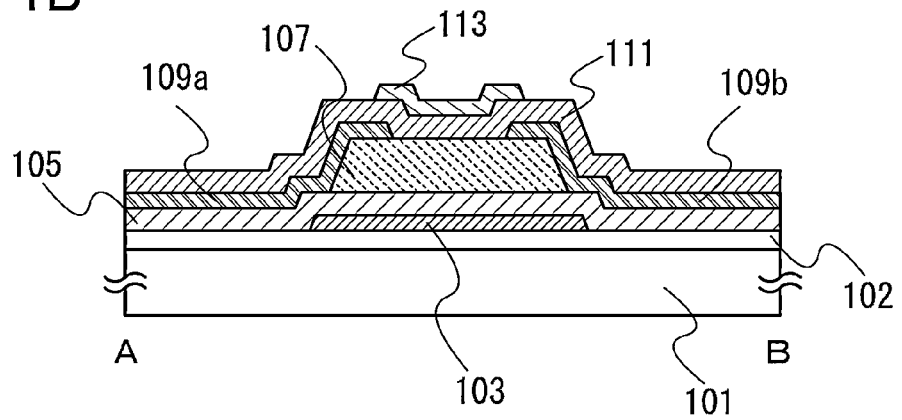
Figure 1C:
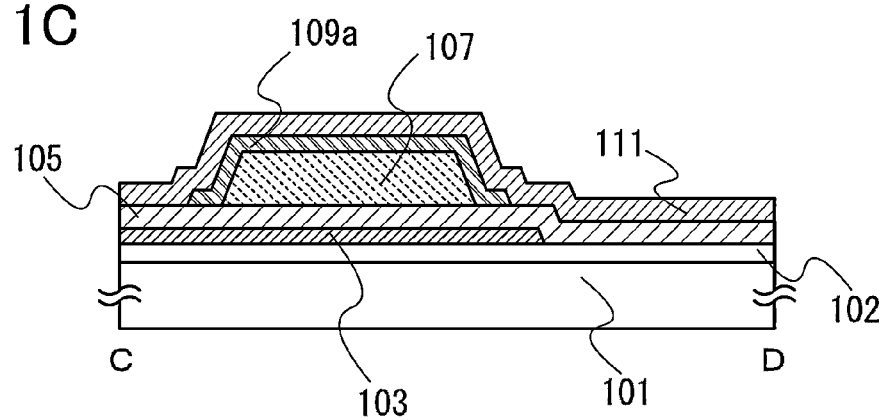

FIG. 1A is a plan view of a transistor 100, and FIG. 1B is a cross-sectional view taken along line A-B in the transistor 100. FIG. 1C is a cross-sectional view taken along line C-D in the transistor 100. Note that a base insulating layer 102, a gate insulating layer 105, and an insulating layer 111 are not illustrated in FIG. 1A for convenience. FIG. 1A illustrates a wiring 104 including a first electrode 103 functioning as a gate electrode; an oxide semiconductor layer 107 including a channel formation region; a wiring 110 including a pair of second electrodes 109a and 109b functioning as a source electrode and a drain electrode; and a wiring 114 provided between the pair of second electrodes 109a and 109b, overlapping with the oxide semiconductor layer 107 with the insulating layer 111 provided therebetween, and including a third electrode 113 serving as a back gate electrode. Although the first electrode 103, the pair of second electrodes 109a and 109b, and the third electrode 113 are integrated with the wiring 104, the wiring 110, and the wiring 114, respectively here, the electrodes and the wirings may be formed separately and electrically connected to each other.

In this embodiment, although the first electrode 103, the pair of second electrodes 109a and 109b, and the third electrode 113 function as a gate electrode, a source and a drain electrode, and a back gate electrode, respectively, one embodiment of the present invention is not limited thereto. The first electrode 103, the pair of second electrodes 109a and 109b, and the third electrode 113 each can function as any of a gate electrode, a source electrode, a drain electrode, and a back gate electrode.

As illustrated in FIG. 1B, the transistor 100 is a dual-gate transistor including a gate electrode and a back gate electrode and includes the base insulating layer 102, the first electrode 103, the gate insulating layer 105, the oxide semiconductor layer 107, the pair of second electrodes 109a and 109b, the insulating layer 111, and the third electrode 113, which are provided over a substrate 101.

The first electrode 103 is provided in contact with the base insulating layer 102. The gate insulating layer 105 is provided to cover the first electrode 103. The oxide semiconductor layer 107 is provided in contact with the gate insulating layer 105 to overlap with the first electrode 103. The pair of second electrodes 109a and 109b cover end portions of the oxide semiconductor layer 107. The insulating layer 111 covers part of the oxide semiconductor layer 107 and the pair of second electrodes 109a and 109b. The third electrode 113 is provided on and in contact with the insulating layer 111 and between the pair of second electrodes 109a and 109b.

Further, since the pair of second electrodes 109a and 109b cover the end portions of the oxide semiconductor layer 107, the pair of second electrodes 109a and 109b are in contact with end surfaces of the oxide semiconductor layer 107. Therefore, in a region where the pair of second electrodes 109a and 109b are in contact with the oxide semiconductor layer 107, the width of each of the pair of second electrodes 109a and 109b is larger than the width of a channel formed in the oxide semiconductor layer 107 (see FIG. 1A).

Further, as illustrated in FIG. 1C, since the pair of second electrodes 109a and 109b are in contact with the end surfaces of the oxide semiconductor layer 107, the pair of second electrodes 109a and 109b serve as a heat sink, and when heat is generated due to high on-state current flowing in the oxide semiconductor layer 107, the pair of second electrodes 109a and 109b can dissipate the heat to the outside. As a result, degradation of the transistor 100 due to heat generation can be suppressed.

In addition, in the transistor 100, the width of the first electrode 103 is larger than the width of the oxide semiconductor layer 107 in the channel length direction, the third electrode 113 overlaps with the oxide semiconductor layer 107 with the insulating layer 111 provided therebetween, and the width of the third electrode 113 is at least larger than or equal to the channel length.

Accordingly, end portions of the oxide semiconductor layer 107 which are not covered with the pair of the second electrodes 109a and 109b are covered with the first electrode 103 and the third electrode 113 with the gate insulating layer 105 and the insulating layer 111 provided therebetween. In other words, all of the end portions of the oxide semiconductor layer 107 are covered with the first electrode 103, the pair of second electrodes 109a and 109b, and the third electrode 113.

When the end portions of the oxide semiconductor layer 107 are covered even in the case where the gate insulating layer 105 and the insulating layer 111 are provided between the first electrode 103 and the oxide semiconductor layer 107 and between the third electrode 113 and the oxide semiconductor layer 107, the pair of second electrodes 109a and 109b can serve as a heat sink. Therefore, in the transistor 100, heat which is generated when high on-state current flows in the oxide semiconductor layer 107 can be effectively dissipated to the outside, so that degradation of the transistor 100 due to heat generation can be suppressed.

As the substrate 101, an alkali-free glass substrate formed with a fusion method or a float method, a plastic substrate having heat resistance sufficient to withstand heat treatment performed later, or the like can be used. In addition, a substrate where an insulating film is provided on a surface of a metal substrate such as a stainless steel substrate, or a substrate where an insulating film is provided on a surface of a semiconductor substrate may be used.

As a glass substrate, if the temperature of the heat treatment to be performed later is high, a glass substrate whose strain point is 730° C. or higher is preferably used. As a glass substrate, a glass material such as aluminosilicate glass, aluminoborosilicate glass, or barium borosilicate glass is used, for example. By containing a larger amount of barium oxide (BaO) than boric oxide, a more practical heat-resistant glass substrate is obtained. Therefore, a glass substrate containing BaO and $B_2O_3$ so that the amount of BaO is larger than that of $B_2O_3$ is preferably used.

Note that a substrate formed of an insulator, such as a ceramic substrate, a quartz substrate, or a sapphire substrate, may be used instead of the glass substrate. Alternatively, crystallized glass or the like may be used.

The base insulating layer 102 provided between the substrate 101 and the first electrode 103 can prevent not only diffusion of an impurity element from the substrate 101 but also etching of the substrate 101 during an etching step included in the steps for manufacturing the transistor. Therefore, the thickness of the base insulating layer 102 is preferably, but not limited to, 50 nm or more. Note that the base insulating layer 102 is formed with a single-layer structure or a stacked structure using an oxide insulator and/or a nitride insulator such as silicon oxide, gallium oxide, aluminum oxide, silicon nitride, silicon oxynitride, aluminum oxynitride, and silicon nitride oxide. In particular, aluminum nitride, aluminum nitride oxide, and silicon nitride which have a high thermal conductivity are effective in improving thermal dissipation when used for the base insulating layer 102. In addition, alkali metal such as Li and Na is an impurity for the oxide semiconductor layer 107 described later. Therefore, it is preferable to reduce the content of alkali metal. In the case where a glass substrate including an impurity such as alkali metal is used as the substrate 101, the base insulating layer 102 is preferably formed using a nitride insulator such as silicon nitride or aluminum nitride in order to prevent the entry of the alkali metal.

The first electrode 103 serving as a gate electrode can be formed with a single-layer structure or a stacked structure using a metal material such as molybdenum, titanium, tantalum, tungsten, aluminum, copper, chromium, neodymium, or scandium or an alloy material which includes any of these materials as its main component. In addition, the first electrode 103 can have a single-layer structure or a stacked structure including two or more layers. For example, a single-layer structure of an aluminum film containing silicon, a two-layer structure of an aluminum film and a titanium film stacked thereover, a two-layer structure of a tungsten film and a titanium film stacked thereover, a three-layer structure in which a titanium film, an aluminum film, and a titanium film are stacked in this order, and the like can be given.

There is no limitation on the thickness of the first electrode 103, and the thickness of the first electrode 103 can be determined as appropriate considering the electrical resistance of a conductive film formed using any of the above-described materials and a time necessary for forming the conductive film.

The gate insulating layer 105 is in contact with the oxide semiconductor layer 107 and thus needs to have high quality. This is because the oxide semiconductor layer 107 which is an i-type or a substantially i-type oxide semiconductor layer obtained by removal of impurities (an oxide semiconductor layer whose hydrogen concentration is reduced and to which oxygen is supplied) is extremely sensitive to an interface state and interface electric charge, and thus an interface between the oxide semiconductor layer 107 the gate insulating layer 105 is important.

The gate insulating layer 105 can be formed using any of the above-described oxide insulators. A portion of the gate insulating layer 105 which is in contact with the oxide semiconductor layer 107 preferably contains oxygen, and, in particular, the gate insulating layer 105 preferably contains oxygen whose amount exceeds the stoichiometric proportion. For example, the gate insulating layer 105 may be formed using silicon oxide ($SiO_{2+\alpha}$ (note that $\alpha>0$)) which contains oxygen whose amount exceeds the stoichiometric proportion. By forming the gate insulating layer 105 with the use of the silicon oxide, part of oxygen contained in the gate insulating layer 105 can be supplied to the oxide semiconductor layer 107 in the heat treatment performed in the manufacturing steps of the transistor 100, so that the transistor 100 can have favorable electrical characteristics.

The gate insulating layer 105 may be formed with either a single-layer structure or a stacked structure. When the thickness of the gate insulating layer 105 is increased, gate leakage current can be reduced. When the gate insulating layer 105 is formed using, for example, a high-k material such as hafnium oxide, yttrium oxide, hafnium silicate (HfSi$_x$O$_y$ (x>0, y>0)), hafnium silicate to which nitrogen is added (HfSiO$_x$N$_y$ (x>0, y>0)), or hafnium aluminate (HfAl$_x$O$_y$ (x>0, y>0)), gate leakage current can be reduced. Note that the thickness of the gate insulating layer is preferably greater than or equal to 50 nm and less than or equal to 500 nm.

The oxide semiconductor layer 107 can be formed using any of the following: a four-component metal oxide such as an In—Sn—Ga—Zn-based metal oxide; a three-component metal oxide such as an In—Ga—Zn-based metal oxide, an In—Sn—Zn-based metal oxide, an In—Al—Zn-based metal oxide, a Sn—Ga—Zn-based metal oxide, an Al—Ga—Zn-based metal oxide, a Sn—Al—Zn-based metal oxide, an In—Hf—Zn-based metal oxide, an In—La—Zn-based metal oxide, an In—Ce—Zn-based metal oxide, an In—Pr—Zn-based metal oxide, an In—Nd—Zn-based metal oxide, an In—Sm—Zn-based metal oxide, an In—Eu—Zn-based metal oxide, an In—Gd—Zn-based metal oxide, an In—Tb—Zn-based metal oxide, an In—Dy—Zn-based metal oxide, an In—Ho—Zn-based metal oxide, an In—Er—Zn-based metal oxide, an In—Tm—Zn-based metal oxide, an In—Yb—Zn-based metal oxide, or an In—Lu—Zn-based metal oxide; a two-component metal oxide such as an In—Zn-based metal oxide, a Sn—Zn-based metal oxide, an Al—Zn-based metal oxide, a Zn—Mg-based metal oxide, a Sn—Mg-based metal oxide, an In—Mg-based metal oxide, or an In—Ga-based metal oxide; or a single-component metal oxide containing indium, tin, zinc or the like. The oxide semiconductor layer 107 including the channel region is preferably formed using the metal oxide containing zinc or the metal oxide containing zinc and indium, considering the manufacture of a crystalline oxide semiconductor described later. Here, for example, an In—Ga—Zn-based metal oxide means an oxide containing indium (In), gallium (Ga), and zinc (Zn), and there is no particular limitation on the composition ratio thereof. Further, the In—Ga—Zn-based metal oxide may contain an element other than In, Ga, and Zn.

In addition, it is preferable that impurities such as hydrogen be sufficiently removed from the oxide semiconductor layer 107 and oxygen be sufficiently supplied thereto. Specifically, the hydrogen concentration of the oxide semiconductor layer 107 is $5\times10^{19}$ atoms/cm$^3$ or lower, preferably $5\times10^{18}$ atoms/cm$^3$ or lower, more preferably $5\times10^{17}$ atoms/cm$^3$ or lower. Note that the hydrogen concentration of the oxide semiconductor layer 107 is measured by secondary ion mass spectroscopy (SIMS). By supply of sufficient oxygen, a defect level due to oxygen deficiency in the energy gap of the oxide semiconductor layer 107 is reduced. Accordingly, a carrier density of the oxide semiconductor layer 107 due to a donor such as hydrogen is higher than or equal to $1\times10^{10}$ cm$^{-3}$ and lower than or equal to $1\times10^{13}$ cm$^{-3}$. In this manner, the transistor 100 with extremely favorable off-state current characteristics can be obtained with the use of an i-type (intrinsic) or substantially i-type oxide semiconductor for the oxide semiconductor layer 107. For example, the off-state current (per unit channel width (1 μm) here) at room temperature (25° C.) is 100 zA (1 zA (zeptoampere) is $1\times10^{-21}$ A) or less, preferably 10 zA or less.

In addition, the content of alkali metal such as Li and Na is preferably low, and the concentration of alkali metal in the oxide semiconductor layer 107 is preferably $2\times10^{16}$ cm$^{-3}$ or lower, preferably $1\times10^{15}$ cm$^{-3}$ or lower. Further the content of alkaline earth metal is preferably low because alkaline earth metal is also an impurity. The reason is described below. Note that it has been pointed out that an oxide semiconductor is insensitive to impurities, there is no problem when a considerable amount of metal impurities is contained in the film, and therefore, soda-lime glass which contains a large amount of alkali metal such as sodium (Na) and is inexpensive can also be used (Kamiya, Nomura, and Hosono, "Carrier Transport Properties and Electronic Structures of Amorphous Oxide Semiconductors: The present status", *KOTAI BUTSURI* (*SOLID STATE PHYSICS*), 2009, Vol. 44, pp. 621-633). But such consideration is not appropriate. Alkali metal is not an element included in an oxide semiconductor, and therefore, is an impurity. Also, alkaline earth metal is impurity in the case where alkaline earth metal is not included in an oxide semiconductor. Alkali metal, in particular, Na becomes Na when an insulating film in contact with the oxide semiconductor layer is an oxide and Na diffuses into the insulating film. Further, in the oxide semiconductor layer, Na cuts or enters a bond between metal and oxygen which are included in an oxide semiconductor. As a result, degradation of the electrical characteristics occurs; for example, the field-effect mobility is reduced or the transistor becomes a normally-on transistor in which a drain current flows even in the state where no voltage is applied to the gate electrode (Vg=0), which is caused by the shift of the threshold voltage in the negative direction. In addition, variation in the electrical characteristics also occurs. Such degradation of electrical characteristics of the transistor and variation in the electrical characteristics due to the impurities remarkably appear when the hydrogen concentration in the oxide semiconductor layer is sufficiently low.

An In—Ga—Zn-based metal oxide has a sufficiently high resistance when no electric field is applied thereto and thus can sufficiently reduce off-state current. Further, an In—Ga—Zn-based metal oxide has high field-effect mobility and is therefore a preferable semiconductor material for the transistor of one embodiment of the present invention.

A depletion layer is thicker in the case of using an oxide semiconductor for a channel formation region like the transistor 100, as compared to the case of using a silicon semiconductor for a channel formation region. Accordingly, the channel region is thicker because the channel region is also formed in a depth direction of the oxide semiconductor. Further, when the thickness of the oxide semiconductor is large, a large number of carriers can flow. As a result, high on-state current can be obtained.

The drain withstand voltage of the transistor 100 depends on the thickness of the oxide semiconductor layer 107. Therefore, in order to increase the drain withstand voltage, the thickness of the oxide semiconductor layer 107 is preferably large and may be selected in accordance with the desired drain withstand voltage.

Accordingly, the thickness of the oxide semiconductor layer 107 is preferably greater than or equal to 0.1 μm and less than or equal to 50 μm, preferably greater than or equal to 0.5 μm and less than or equal to 20 μm in consideration of the electrical characteristics such as the on-state current and the drain withstand voltage.

The drain withstand voltage of a transistor using an oxide semiconductor is now described.

When the electric field in the semiconductor reaches a certain threshold value, impact ionization occurs, carriers accelerated by the high electric field impact crystal lattices in a depletion layer, thereby generating pairs of electrons and holes. When the electric field becomes even higher, the pairs of electrons and holes generated by the impact ionization are further accelerated by the electric field, and the impact ionization is repeated, resulting in an avalanche breakdown in which current is increased exponentially. The impact ionization occurs because carriers (electrons and holes) have kinetic energy that is larger than or equal to the band gap of the semiconductor. It is known that the impact ionization coefficient that shows probability of impact ionization has correlation with the band gap and that the impact ionization is unlikely to occur as the band gap is increased.

Since the band gap of the oxide semiconductor is about 3.15 eV, which is larger than the band gap of silicon, i.e., about 1.12 eV, the avalanche breakdown is unlikely to occur. Therefore, a transistor using the oxide semiconductor has a high drain withstand voltage, and an exponential sudden increase of on-state current is expected to be unlikely to occur when a high electric field is applied.

Next, hot-carrier degradation of a transistor using an oxide semiconductor is described.

The hot-carrier degradation means deterioration of transistor characteristics, e.g., shift in the threshold voltage or gate leakage current, which is caused as follows: electrons that are accelerated to be rapid are injected in the vicinity of a drain in a channel into a gate insulating film and become fixed electric charge or form trap levels at the interface between the gate insulating film and the oxide semiconductor. The factors of the hot-carrier degradation are, for example, channel-hot-electron injection (CHE injection) and drain-avalanche-hot-carrier injection (DAHC injection).

Since the band gap of a silicon semiconductor is narrow, electrons are likely to be generated like an avalanche owing to an avalanche breakdown, and electrons that are accelerated to be so rapid as to go over a barrier to the gate insulating film are increased in number. However, the oxide semiconductor described in this embodiment has a wide band gap; therefore, the avalanche breakdown is unlikely to occur and resistance to the hot-carrier degradation is higher than that of a silicon semiconductor. In this manner, the transistor including an oxide semiconductor has high drain withstand voltage, and the transistor including an oxide semiconductor is suitable for a semiconductor device for high power application such as an insulated-gate field effect transistor (IGFET), a junction field-effect transistor, and a Schottky barrier diode.

The pair of second electrodes 109a and 109b can be formed using any of the materials given in the description of the first electrode 103. The thickness and structure of the electrodes are appropriately selected based on the description of the first electrode 103. Note that since the pair of second electrodes 109a and 109b function as a heat sink which dissipates heat generated when the on-state current flows in the oxide semiconductor layer 107 to the outside, the pair of second electrodes 109a and 109b are preferably formed using a metal material or an alloy material which easily conducts heat.

The insulating layer 111 can be formed using any of the oxide insulators given in the description of the gate insulating layer 105. Since the insulating layer 111 is also in contact with the oxide semiconductor layer 107, a portion of the insulating layer 111 which is in contact with the oxide semiconductor layer 107 preferably includes oxygen, and the insulating layer 111 is preferably formed using silicon oxide ($SiO_{2+\alpha}$ (note that $\alpha>0$)) which contains oxygen whose amount exceeds the stoichiometric proportion, in particular. By forming the insulating layer 111 with the use of the silicon oxide, part of oxygen contained in the insulating layer 111 can be supplied to the oxide semiconductor layer 107 in the heat treatment performed in the manufacturing steps of the transistor 100, so that the transistor 100 can have favorable electrical characteristics. In addition, the insulating layer 111 may be formed using the high-k material given in the description of the gate insulating layer 105. Further the insulating layer 111 may be formed with either a single-layer structure or a stacked structure. When the thickness of the insulating layer 111 is increased, gate leakage current on the back gate side can be reduced. The thickness of the insulating layer 111 is preferably greater than or equal to 50 nm and less than or equal to 500 nm.

The third electrode 113 serving as a back gate electrode can be formed using any of the materials given in the description of the first electrode 103, and the thickness and structure of the third electrode 113 may be appropriately selected based on the description of the first electrode 103.

In view of reliability, the electrical characteristics of the transistor including an oxide semiconductor are changed by irradiation with visible light or ultraviolet light or application of heat or an electric field. As an example of a change of the electrical characteristics, the transistor becomes a normally-on transistor in which the drain current flows even in the state where no voltage is applied to the gate electrode (Vg=0). In the case of an n-channel transistor, in which an electron is a majority carrier, an electron in the drain current flows in a region where a depletion layer is formed. Therefore, in the transistor, the region where an electron flows includes a region in the vicinity of a top surface of the oxide semiconductor layer 107, where the pair of second electrodes 109a and 109b and the insulating layer 111 are provided. Therefore, a hole is induced in the insulating layer 111 in contact with the oxide semiconductor layer 107 (in particular, in a region in the vicinity of a bottom surface of the insulating layer 111 in contact with the oxide semiconductor layer 107) and the transistor becomes normally-on as time passes. Thus, since the transistor described in this embodiment is a dual-gate transistor including the third electrode 113, voltage can be freely applied to the third electrode 113, and the threshold voltage (Vth) can be controlled, so that the transistor can be prevented from becoming normally-on.

In addition, since the transistor described in this embodiment is a dual-gate transistor, voltage can be applied to the third electrode 113, and a channel can be efficiently formed even when the thickness of the oxide semiconductor layer 107 is large, so that high on-state current can be obtained.

Here, the shape of the third electrode 113 is described with reference to FIGS. 2A to 2D.

Figure 2A:
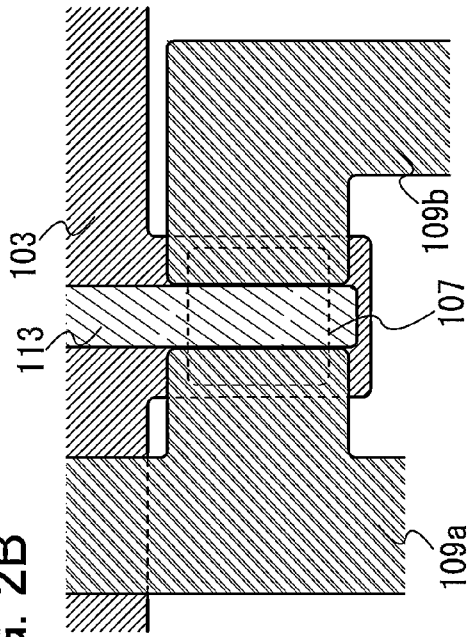
FIGS. 2A to 2D are plan views illustrating a method for manufacturing a non-linear element that is one embodiment of the present invention.

The third electrode 113 illustrated in FIG. 2A has the same shape as the third electrode 113 illustrated in FIG. 1A. The third electrode 113 is provided to be parallel to the first electrode 103 and overlaps with the pair of second electrodes 109a and 109b with the insulating layer 111 provided therebetween. In that case, voltage applied to the third electrode 113 and voltage applied to the first electrode 103 can be controlled independently.

Figure 2B:
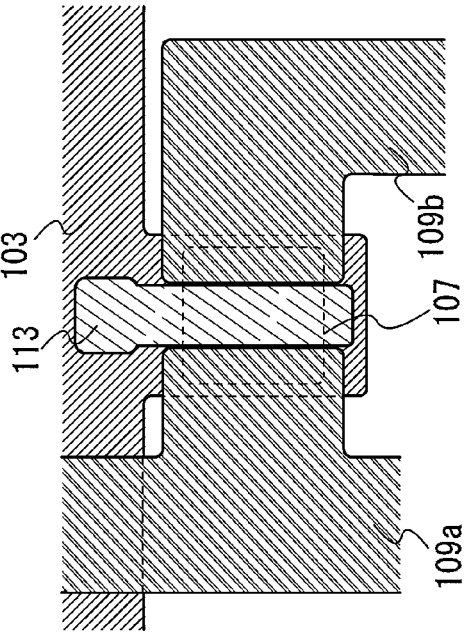

The third electrode 113 illustrated in FIG. 2B is parallel to the first electrode 103 but does not overlap with the pair of second electrodes 109a and 109b. Also in this structure, the voltage applied to the third electrode 113 and the voltage applied to the first electrode 103 can be controlled independently.

Figure 2C:
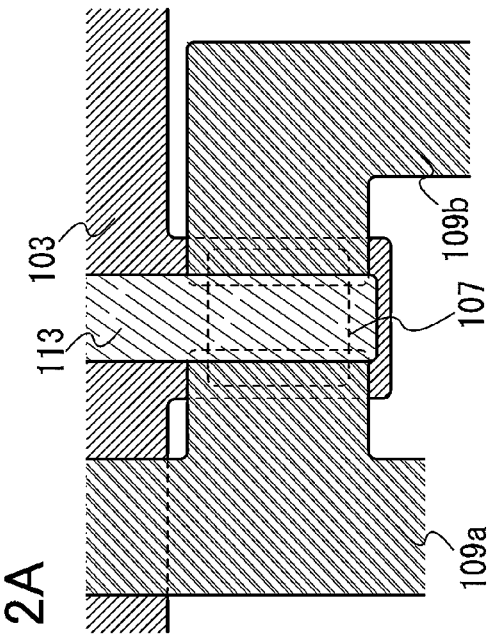

The third electrode 113 illustrated in FIG. 2C can be connected to the first electrode 103. In other words, the first electrode 103 and the third electrode 113 are connected to each other in an opening portion 150 formed in the gate insulating layer 105 and the insulating layer 111. In this structure, the voltage applied to the third electrode 113 is equal to the voltage applied to the first electrode 103.

Figure 2D:
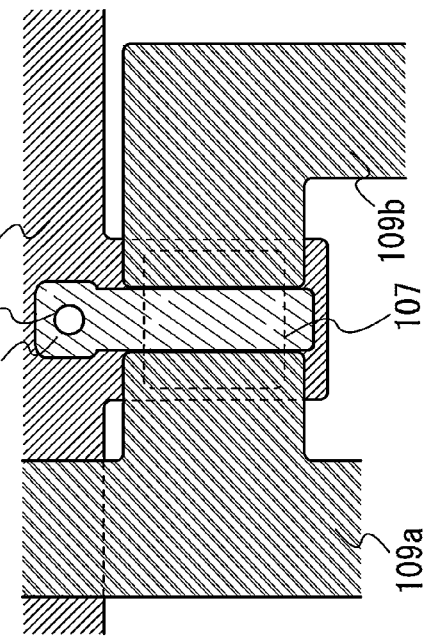

Further, a structure illustrated in FIG. 2D may be employed, in which the third electrode 113 is not connected to the first electrode 103 but is in a floating state.

In addition, in the structures illustrated in FIGS. 2C and 2D, the third electrode 113 may overlap with the pair of second electrodes 109a and 109b with the insulating layer 111 provided therebetween.

Although not illustrated in FIGS. 1A to 1C, a protective insulating layer may be provided over the insulating layer 111 and the third electrode 113 in the transistor 100.

Next, a method for manufacturing the transistor 100 is described with reference to FIGS. 3A to 3D.

The base insulating layer 102 is formed over the substrate 101. Through this process, impurities in a glass substrate can be prevented from entering the transistor which is to be formed.

The base insulating layer 102 can be formed by a sputtering method, a CVD method, a coating method, or the like. In this embodiment, a silicon oxide film is formed by a sputtering method with the use of a silicon target. In order to remove moisture and hydrogen in the base insulating layer 102, the substrate 101 may be subjected to heat treatment after the base insulating layer 102 is formed.

Next, the first electrode 103 is formed over the base insulating layer 102. Note that the step for forming the first electrode 103 is combined with a step for forming the wiring 104 (see FIG. 1A). The first electrode 103 can be formed in such a manner that a conductive film is formed over the substrate 101 by a sputtering method, a vacuum evaporation method, or a CVD method, a resist mask is formed over the conductive film by a first photolithography step, and the conductive film is etched using the resist mask. Alternatively, the resist mask is formed by a printing method or an ink jet method instead of the photolithography step, so that the number of steps for forming the first electrode 103 can be reduced. Note that end portions of the first electrode 103 preferably have a tapered shape because the coverage with the gate insulating layer 105 formed later can be improved. Note that the taper shape can be obtained by etching while the resist mask is made to recede.

In this embodiment, a conductive film (e.g., a tungsten film) with a thickness of 150 nm is formed by a sputtering method and etched with the use of a resist mask formed through the first photolithography step, so that the first electrode 103 is formed. Note that the etching step with the use of the resist mask includes a step for removing the resist mask even when its description is not expressly made in this specification.

Next, the gate insulating layer 105 covering the first electrode 103 is formed. The gate insulating layer 105 is in contact with the oxide semiconductor layer 107 which is to be formed later, and thus, needs to have high quality. When the oxide semiconductor layer 107 is in contact with the gate insulating layer 105 having high quality, the interface state density between the oxide semiconductor layer 107 and the gate insulating layer 105 is reduced and the interface characteristics become favorable. As a result, the transistor 100 completed can have favorable electrical characteristics.

The gate insulating layer 105 can be formed by any of the methods given in the description of the base insulating layer 102. In this embodiment, silicon oxide ($SiO_{2+\alpha}$ (note that $\alpha>0$)) containing oxygen whose amount exceeds the stoichiometric proportion is formed as the gate insulating layer 105. Note that the silicon oxide formed has a thickness of 200 nm.

When the silicon oxide is formed by a sputtering method, a silicon target or a quartz target is used as a target and oxygen or a mixed gas of oxygen and argon is used as a sputtering gas. At that time, the gate insulating layer 105 is preferably formed while hydrogen, moisture, hydroxyl groups, hydride, or the like remaining in a process chamber are removed. An entrapment vacuum pump is preferably used in order to remove hydrogen, water, hydroxyl groups, hydride, or the like remaining in the process chamber. As the entrapment vacuum pump, for example, a cryopump, an ion pump, or a titanium sublimation pump is preferably used. The evacuation unit may be a turbo pump provided with a cold trap. Hydrogen, water, hydroxyl groups, hydride, or the like is removed from the process chamber which is evacuated with a cryopump; thus, when the gate insulating layer 105 is formed in the process chamber, the concentration of hydrogen, water, hydroxyl groups, or hydride contained in the gate insulating layer 105 can be reduced.

It is preferable to use a high-purity gas from which an impurity such as hydrogen, water, a hydroxyl group, or hydride is removed to a concentration of several ppm or several ppb, as a sputtering gas used when the gate insulating layer 105 is formed.

In this embodiment, the substrate 101 is transferred to the process chamber, a sputtering gas containing high-purity oxygen, from which hydrogen, water, hydroxyl groups, hydride, or the like is removed, is introduced, and the silicon oxide is formed as the gate insulating layer 105 over the substrate 101 using a silicon target. Note that the gate insulating layer 105 may be formed while the substrate 101 is heated.

In addition, in the case where the gate insulating layer 105 is formed with a stacked structure, for example, silicon nitride may be formed between the silicon oxide and the substrate 101. The silicon nitride is formed using a silicon target and sputtering gas containing high-purity nitrogen from which hydrogen, water, hydroxyl groups, hydride, or the like is removed. Further it is preferable that the silicon nitride be formed while hydrogen, water, hydroxyl groups, hydride, or the like remaining in the process chamber is removed in a manner similar to the case of the silicon oxide.

In the case where the silicon nitride and the silicon oxide are stacked to form the gate insulating layer 105, the silicon nitride and the silicon oxide can be formed in the same process chamber with the same silicon target. In that case, a sputtering gas containing nitrogen is introduced and silicon nitride is formed using a silicon target mounted in the process chamber, and then, the sputtering gas is switched to a sputtering gas containing oxygen and the same silicon target is used to form silicon oxide. The silicon nitride and the silicon oxide can be successively formed by this method without exposure to the air, whereby hydrogen, water, a hydroxyl group, hydride, or the like can be prevented from being adsorbed on a surface of the silicon nitride.

Further, preheat treatment is preferably performed before the gate insulating layer 105 is formed, in order to remove hydrogen, water, hydroxyl groups, or hydride which remains on the inner wall of the process chamber, on a surface of the target, or inside the target material. After the preheat treatment, the substrate 101 or the process chamber is cooled and then the gate insulating layer 105 is formed without exposure to the air. In that case, not water but oil or the like is preferably used as a coolant for the target.

Further, in the case where the gate insulating layer 105 is formed by a CVD method, for example, by a high-density plasma CVD with the use of a microwave (e.g., its frequency is 2.45 GHz), the gate insulating layer which is dense and has high withstand voltage and high quality can be formed. In addition, since the gate insulating layer formed by high-density plasma CVD can have a uniform thickness, the gate insulating layer has excellent step coverage. Further, as for the gate insulating layer formed using high-density plasma CVD, the thickness can be controlled precisely.

Next, an oxide semiconductor film 106 is formed to overlap with the first electrode 103 with the gate insulating layer 105 provided therebetween. The oxide semiconductor film 106 can be formed over the gate insulating layer 105 by a sputtering method, a molecular beam epitaxy method, an atomic layer deposition method, a pulsed laser deposition method, a coating method, or a printing method.

In this embodiment, the oxide semiconductor film 106 is formed by a sputtering method. The oxide semiconductor film 106 is formed over the gate insulating layer 105 in such a manner that a sputtering gas from which hydrogen, water, hydroxyl groups, hydride, or the like is removed is introduced into the process chamber and a metal oxide is used as a target while the substrate is held in the process chamber held in a reduced-pressure state and moisture remaining in the process chamber is removed. Hydrogen, water, hydroxyl groups, hydride, or the like remaining in the process chamber may be removed in a manner similar to the gate insulating layer 105. Consequently, impurities such as hydrogen, water, hydroxyl groups, or hydride, (and preferably a compound containing a carbon atom) are exhausted from the process chamber, so that the concentration of the impurities contained in the oxide semiconductor film 106 can be reduced. Further, the oxide semiconductor film 106 may be formed while the substrate 101 is heated.

As the target used for forming the oxide semiconductor film 106 by a sputtering method, a metal oxide target containing at least zinc or a metal oxide target containing at least zinc and indium can be used. In this embodiment, the oxide semiconductor film 106 with a thickness of 500 nm is deposited using an In—Ga—Zn-based metal oxide target ($In_2O_3$:$Ga_2O_3$:ZnO=1:1:2 [molar ratio]). As other examples of the metal oxide target, a target having a composition of $In_2O_3$:$Ga_2O_3$:ZnO=1:1:1 [molar ratio], a target having a composition of In:Ga:Zn=1:1:0.5 [atomic ratio], a target having a composition of In:Ga:Zn=1:1:1 [atomic ratio], and the like are given. Any of the above-described metal oxide targets may contain $SiO_2$ at 2 wt % or more and 10 wt % or less. Note that the filling rate of the metal oxide target is greater than or equal to 90% and less than or equal to 100%, preferably greater than or equal to 95% and less than or equal to 99.9%. By using the metal oxide target with high filling rate, a dense oxide semiconductor film is formed.

The oxide semiconductor film 106 is formed in a rare gas (typically argon) atmosphere, an oxygen atmosphere, or an atmosphere including a rare gas (typically argon) and oxygen. It is preferable to use a high-purity gas from which an impurity such as hydrogen, water, a hydroxyl group, or hydride is removed to a concentration of several ppm or several ppb, as a sputtering gas used when the oxide semiconductor film 106 is formed.

For example, formation conditions are set as follows: the distance between the substrate 101 and the target is 170 mm, the substrate temperature is 250° C., the pressure is 0.4 Pa, and the direct current (DC) power is 0.5 kW.

As pretreatment, it is preferable that the substrate 101 subjected to the steps up to the formation of the gate insulating layer 105 be preheated and impurities such as hydrogen, water, hydroxyl groups, or hydride adsorbed on the substrate 101 be eliminated and exhausted so that hydrogen is contained in the oxide semiconductor film 106 as little as possible. Note that exhaust is preferably performed using a cryopump at the time of the preheating. Note that this preheating may be omitted. Alternatively, the preheating may be performed on the substrate 101 before the first electrode 103 is formed or after the oxide semiconductor layer 107 is formed later.

Note that before the oxide semiconductor film 106 is formed by sputtering, reverse sputtering in which plasma is generated by introduction of an argon gas is preferably performed so that dust or an oxide film which is attached to a surface of the gate insulating layer 105 is removed, in which case the resistance at an interface between the gate insulating layer 105 and the oxide semiconductor film 106 can be reduced. The reverse sputtering refers to a method of modifying a surface of a substrate by applying a voltage to the substrate using an RF power source in an argon atmosphere to form plasma in a vicinity of the substrate. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

Figure 3A:
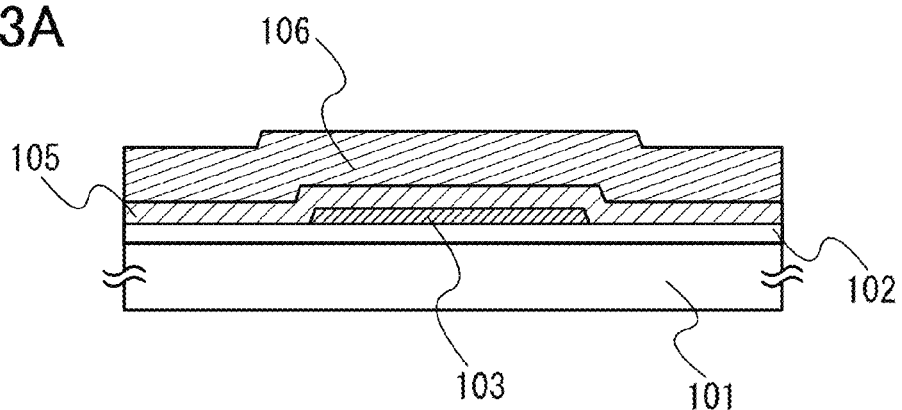
FIGS. 3A to 3D are cross-sectional views illustrating a method for manufacturing a non-linear element that is one embodiment of the present invention.

The structure obtained through the steps up to here is illustrated in FIG. 3A.

Next, the oxide semiconductor film 106 is etched using a resist mask formed through a second photolithography step, so that a first island-shaped oxide semiconductor layer is formed.

The step for forming the first island-shaped oxide semiconductor layer is described. The first island-shaped oxide semiconductor layer is formed by etching with the use of the resist mask formed through the second photolithography step. The second photolithography step is similar to the first photolithography step.

For the etching of the oxide semiconductor film 106, either wet etching or dry etching may be employed. In addition, these may be combined. As an etchant used for wet etching, a mixed solution of phosphoric acid, acetic acid, and nitric acid, an ammonia hydrogen peroxide mixture (hydrogen peroxide water at 31 wt %:ammonia water at 28 wt %:water=5:2:2), or the like can be used. In addition, ITO07N (produced by KANTO CHEMICAL CO., INC.) may also be used.

The etchant after the wet etching is removed together with the etched material by cleaning. The waste liquid including the etchant and the etched material may be purified and the material may be reused. When a material such as indium is collected from the waste liquid after the etching and reused, the resources can be efficiently used and the cost can be reduced.

As the etching gas for dry etching, a gas containing chlorine (chlorine-based gas such as chlorine ($Cl_2$), boron trichloride ($BCl_3$), silicon tetrachloride ($SiCl_4$), or carbon tetrachloride ($CCl_4$)) is preferably used.

Alternatively, a gas containing fluorine (fluorine-based gas such as carbon tetrafluoride ($CF_4$), sulfur hexafluoride ($SF_6$), nitrogen trifluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into a desired shape, the etching conditions (the amount of electric power applied to a coil-shaped electrode, the amount of electric power applied to an electrode on a substrate side, the temperature of the electrode on the substrate side, or the like) is adjusted as appropriate.

Next, first heat treatment is performed on the first island-shaped oxide semiconductor layer to form an oxide semiconductor layer 126.

The temperature of the first heat treatment is higher than or equal to 400° C. and lower than or equal to 750° C., preferably higher than or equal to 400° C. and lower than the strain point of the substrate 101. Here, the substrate is introduced into an electric furnace that is a kind of heat treatment apparatus and heat treatment is performed on the first island-shaped oxide semiconductor layer at 450° C. in an atmosphere of an inert gas such as nitrogen or a rare gas for one hour. After that, the oxide semiconductor layer 126 is not exposed to the air; consequently, hydrogen, water, a hydroxyl group, hydride, or the like can be prevented from entering the oxide semiconductor layer 126. As a result, the oxide semiconductor layer 126 whose hydrogen concentration is reduced can be obtained. That is, at least one of dehydration and dehydrogenation of the first island-shaped oxide semiconductor layer can be performed by this first heat treatment.

Further, in addition to the dehydration and dehydrogenation, the first heat treatment is also combined with treatment by which, in the case where the gate insulating layer 105 contains oxygen, part of the oxygen is diffused into an interface between the gate insulating layer 105 and the first island-shaped oxide semiconductor layer or the vicinity thereof. As a result of the treatment, the oxide semiconductor layer 126 whose oxygen deficiency is reduced can be obtained.

Note that it is preferable that in the first heat treatment, hydrogen, water, a hydroxyl group, hydride, or the like be not contained in nitrogen or a rare gas such as helium, neon, or argon. Alternatively, the purity of nitrogen or a rare gas such as helium, neon, or argon which is introduced into the heat treatment apparatus is greater than or equal to 6 N (99.9999%), preferably greater than or equal to 7 N (99.99999%) (i.e., the impurity concentration is lower than or equal to 1 ppm, preferably lower than or equal to 0.1 ppm).

The heat treatment apparatus used for the first heat treatment is not limited to a particular apparatus, and the apparatus may be provided with a device for heating an object to be processed by heat radiation or heat conduction from a heating element such as a resistance heating element. For example, an electric furnace, or a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas.

Further, the first heat treatment may be performed before the first island-shaped oxide semiconductor layer is formed. In other words, the first heat treatment may be performed on the oxide semiconductor film 106. In that case, the substrate is taken out of the heat treatment apparatus after the first heat treatment, and then the second photolithography step and the etching step are performed.

Figure 3B:
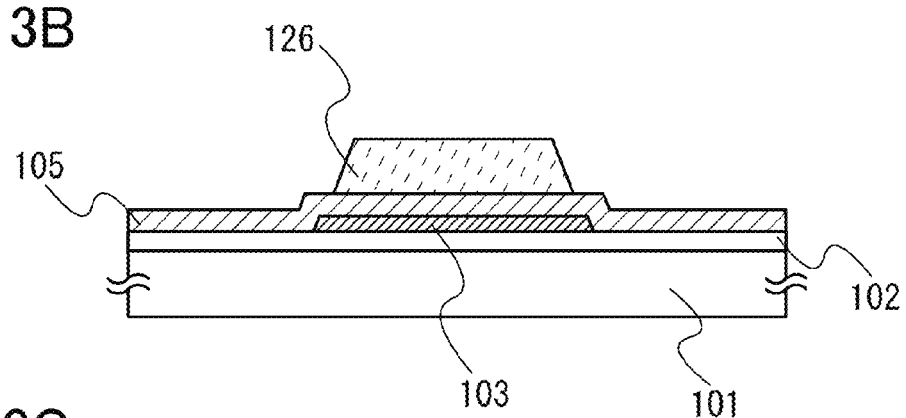

The structure obtained through the steps up to here is illustrated in FIG. 3B.

Then, a conductive film which is to be processed into the pair of second electrodes 109a and 109b is formed over the gate insulating layer 105 and the oxide semiconductor layer 126. After that, the conductive film is etched using a resist mask formed through a third photolithography step, so that the pair of second electrodes 109a and 109b are formed. The method for forming the pair of second electrodes 109a and 109b may be similar to the method for forming the first electrode 103. In this embodiment, the conductive film is formed to a thickness of 150 nm using titanium by a sputtering method. Note that the step for forming the pair of second electrodes 109a and 109b is combined with a step for forming the wiring 110 (see FIG. 1A).

Figure 3C:
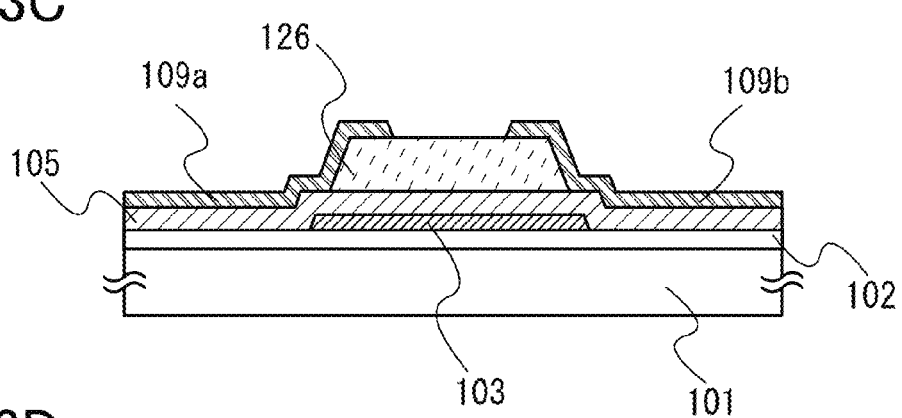

The structure obtained through the steps up to here is illustrated in FIG. 3C.

Next, the insulating layer 111 is formed in contact with the pair of second electrodes 109a and 109b and part of the oxide semiconductor layer 126. The method for forming the insulating layer 111 may be similar to the method for forming the gate insulating layer 105. In this embodiment, the insulating layer 111 is formed by a sputtering method with the use of silicon oxide. Note that the thickness of the insulating layer 111 is 200 nm. After that, second heat treatment whose heat temperature is different from that of the first heat treatment is performed. By the second heat treatment, part of oxygen included in the gate insulating layer 105 and the insulating layer 111 is supplied to the oxide semiconductor layer 126, so that the oxide semiconductor layer 107 is formed. As the heat temperature of the second heat treatment gets higher, the amount of change in the threshold voltage which is caused by light irradiation or application of a BT stress becomes small. However, when the heat temperature is higher than 320° C., the on-state characteristics are degraded. Thus, the second heat treatment is performed under the conditions that the atmosphere is an inert atmosphere, an oxygen atmosphere, or a mixed atmosphere of oxygen and nitrogen, and the heat temperature is higher than or equal to 200° C. and lower than or equal to 400° C., preferably higher than or equal to 250° C. and lower than or equal to 320° C. In addition, heating time of the heat treatment is longer than or equal to 1 minute and shorter than or equal to 24 hours. Note that the second heat treatment may be performed after the formation of the third electrode 113 to be formed later. In addition, silicon nitride may be formed over the insulating layer 111 to prevent the intrusion of moisture or alkali metal. Since alkali metal such as Li or Na is an impurity, the content of alkali metal is preferably reduced. The concentration of the alkali metal in the oxide semiconductor layer 107 is lower than or equal to $2 \times 10^{16}$ cm$^{-3}$, preferably, lower than or equal to $1 \times 10^{15}$ cm$^{-3}$. Further the content of alkaline earth metal is preferably low because alkaline earth metal is also an impurity. Note that after the third electrode 113 described later is formed, silicon nitride may be formed as a protective insulating layer. In that case, the following steps and the like are appropriately performed: a step for forming opening portions in the protective insulating layer; a step for forming a conductive film to be electrically connected to the first electrode 103, the pair of second electrodes 109a and 109b, and the third electrode 113.

Next, the third electrode 113 is formed in contact with the insulating layer 111 so as to overlap with a channel formation region of the oxide semiconductor layer 107. The third electrode 113 is formed in such a manner that a conductive film is formed on the insulating layer 111 and then the conductive film is etched using a resist mask formed through a fourth photolithography step. The method for forming the third electrode 113 may be similar to the method for forming the first electrode 103. In this embodiment, the conductive film is formed to a thickness of 150 nm by a sputtering method with the use of molybdenum. Note that the step for forming the third electrode 113 is combined with a step for forming the wiring 114 (see FIG. 1A).

Figure 3D:
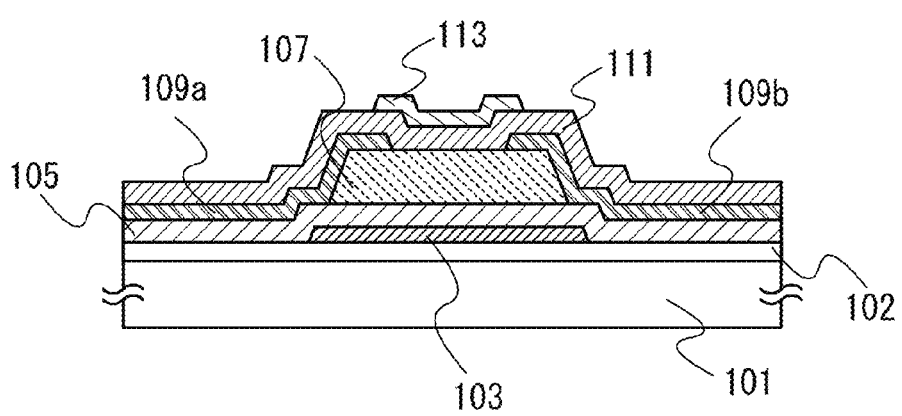

The structure obtained through the steps up to here is illustrated in FIG. 3D.

Through the above steps, a non-linear element with high withstand voltage, low reverse saturation current, and high on-state current can be obtained. Note that this embodiment can be implemented in combination with any of the structures described in other embodiments, as appropriate.

Embodiment 2

In this embodiment, a non-linear element whose structure is partly different from that of the non-linear element described in Embodiment 1 will be described. Note that a transistor is used as an example also in this embodiment.

Figure 4A:
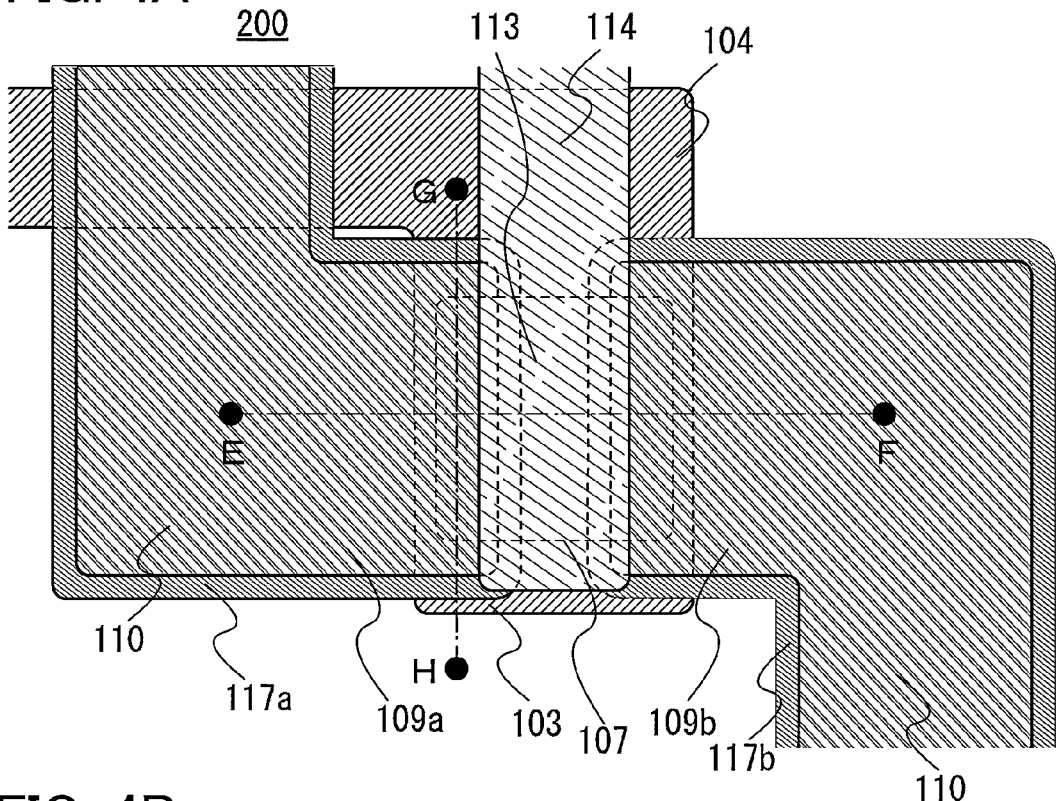
FIGS. 4A to 4C are a plan view and cross-sectional views illustrating a non-linear element that is one embodiment of the present invention.
Figure 4B:
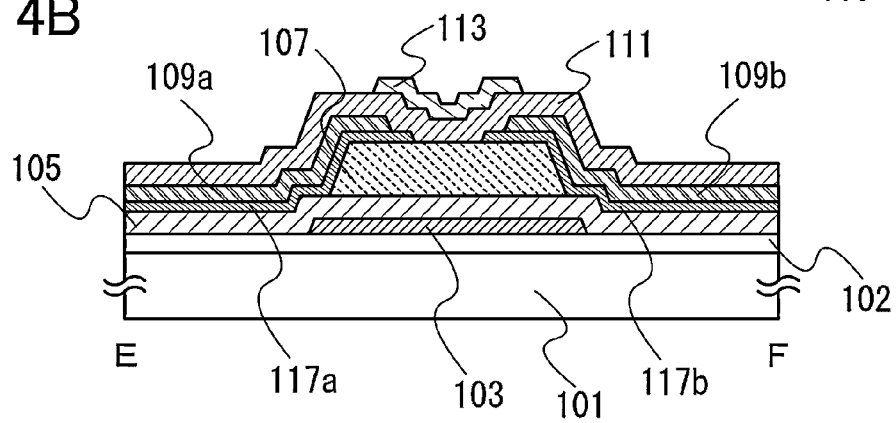
Figure 4C:
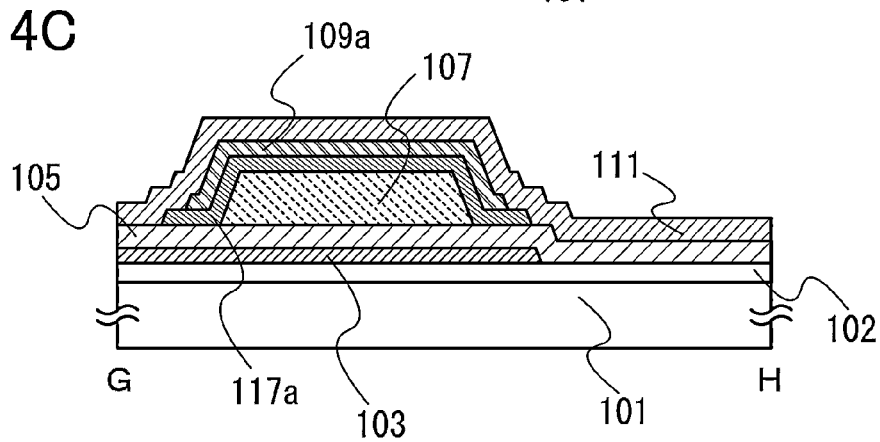

FIG. 4A is a plan view of a transistor 200, and FIG. 4B is a cross-sectional view taken along line E-F in the transistor 200. FIG. 4C is a cross-sectional view taken along line G-H in the transistor 200. Note that the transistor 200 is a modified example of the transistor 100; therefore, in FIGS. 4A to 4C, the same reference numerals are used for the same parts as those in FIGS. 1A to 1C, and detailed description of the same reference numerals is omitted.

As illustrated in FIG. 4B, the transistor 200 is a dual-gate transistor and includes a base insulating layer 102, a first electrode 103, a gate insulating layer 105, an oxide semiconductor layer 107, $n^+$ layers 117a and 117b, a pair of second electrodes 109a and 109b, an insulating layer 111, and a third electrode 113, which are provided over a substrate 101.

The first electrode 103 is provided in contact with the base insulating layer 102. The gate insulating layer 105 is provided to cover the first electrode 103. The oxide semiconductor layer 107 is provided in contact with the gate insulating layer 105 to overlap with the first electrode 103. The $n^+$ layers 117a and 117b are formed to cover the gate insulating layer 105 and end portions of the oxide semiconductor layer 107. The pair of second electrodes 109a and 109b are provided over the $n^+$ layers 117a and 117b to cover the end portions of the oxide semiconductor layer 107. The insulating layer 111 covers part of the oxide semiconductor layer 107 and the pair of second electrodes 109a and 109b. The third electrode 113 is provided on and in contact with the insulating layer 111 and between the pair of second electrodes 109a and 109b.

The $n^+$ layers 117a and 117b are formed between the oxide semiconductor layer 107 and the pair of second electrodes 109a and 109b, whereby contact resistance between the oxide semiconductor layer 107 and the pair of second electrodes 109a and 109b can be reduced. As a result, high on-state current can be obtained. In addition, when the $n^+$ layers 117a and 117b are formed, parasitic capacitance can be reduced and the amount of change in on-state current (Ion degradation) between before and after application of a negative gate stress in a BT test can be suppressed.

Although only one of the pair of second electrodes 109a and 109b is illustrated in FIG. 1C, an etching step is performed using the pair of second electrodes 109a and 109b as masks to form the $n^+$ layers 117a and 117b, and thus the $n^+$ layers 117a and 117b are processed so that the end portions of the $n^+$ layers 117a and 117b protrude from the pair of second electrodes 109a and 109b. Thus, the channel length of the transistor 200 is determined by the distance between the $n^+$ layer 117a and the $n^+$ layer 117b. Although the pair of second electrodes 109a and 109b face end surfaces of the oxide semiconductor layer 107 with the $n^+$ layers 117a and 117b provided therebetween, the pair of second electrodes 109a and 109b serve as a heat sink in a manner similar to Embodiment 1 because the $n^+$ layers 117a and 117b are not formed to be extremely thick and do not block the conduction of heat generated in the oxide semiconductor layer 107. As a result, heat which is generated when high on-state current flows in the oxide semiconductor layer 107 can be dissipated to the outside, so that degradation of the transistor 200 due to heat generation can be suppressed.

Steps for manufacturing the transistor 200 are described below. The steps for manufacturing the transistor 200 are the same as those for manufacturing the transistor 100 except a step for forming the $n^+$ layers 117a and 117b. Therefore, description is made with reference to FIGS. 3A and 3B and FIGS. 5A to 5C.

In accordance with the manufacturing steps described in Embodiment 1 (after the structure of FIG. 3A is obtained), the structure of FIG. 3B is obtained.

Next, a film 115 to be the $n^+$ layers 117a and 117b is formed to a thickness greater than or equal to 1 nm and less than or equal to 200 nm over the gate insulating layer 105 and the oxide semiconductor layer 107 with the use of an In—Zn-based metal oxide, an In—Sn-based metal oxide, or a single-component metal oxide containing indium or tin. The method for forming the film 115 may be the same as the method for forming the oxide semiconductor layer 107. In addition, $SiO_2$ may be contained in the above material for the $n^+$ layer. In this embodiment, an In—Sn-based metal oxide film containing $SiO_2$ is formed to a thickness of 100 nm.

Figure 5A:
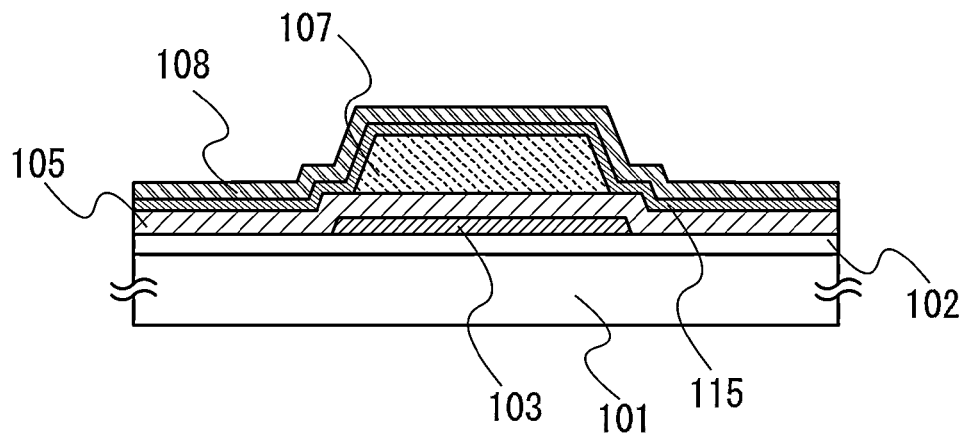
FIGS. 5A to 5C are cross-sectional views illustrating a method for manufacturing a non-linear element that is one embodiment of the present invention.
Figure 5B:
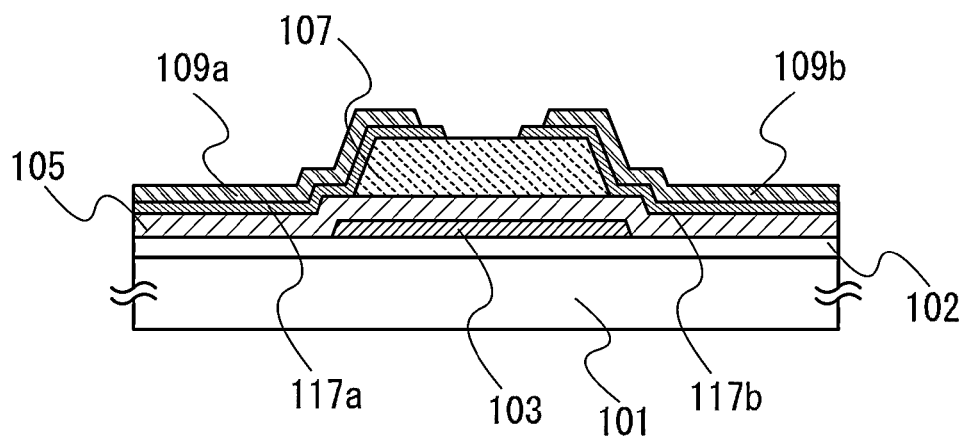
Figure 5C:
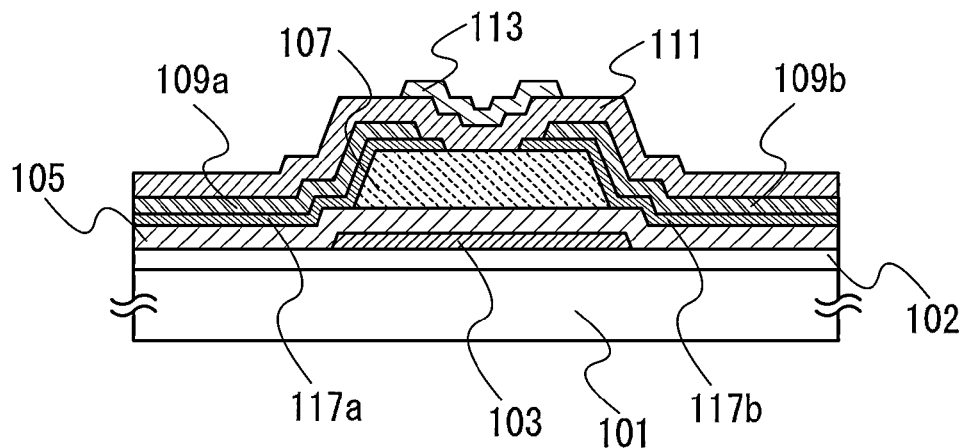

Next, a conductive film 108 for forming the pair of second electrodes 109a and 109b is formed over the film 115 which is to be the $n^+$ layers (see FIG. 5A). The conductive film is processed to form the pair of second electrodes 109a and 109b. Note that the step for forming the pair of second electrodes 109a and 109b is combined with a step for forming a wiring 110 (see FIG. 4A).

Then, the film 115 is processed using the pair of second electrodes 109a and 109b as masks to form the $n^+$ layers 117a and 117b. Through this processing, the $n^+$ layers 117a and 117b are formed so that the end portions thereof protrude from the pair of second electrodes 109a and 109b (see FIG. 5B). Thus, the channel length of the transistor 200 is determined by the distance between the $n^+$ layer 117a and the $n^+$ layer 117b. On the other hand, the channel length of the transistor 100 described in Embodiment 1 is determined by the distance between the pair of second electrodes 109a and 109b. It is preferable that the taper angle of each of the end portions of the $n^+$ layers 117a and 117b (an angle formed by the side surface of either the $n^+$ layer 117a or the $n^+$ layers 117b and a planar surface of the substrate 101) be less than or equal to 30°.

The subsequent steps are the same as those of Embodiment 1. The insulating layer 111 covering part of the oxide semiconductor layer 107 and the pair of second electrodes 109a and 109b is formed. Further, the third electrode 113 is formed in contact with the insulating layer 111 so as to overlap with a channel formation region of the oxide semiconductor layer 107 (see FIG. 5C). Details of the steps are the same as those of Embodiment 1.

Through the above steps, a non-linear element with high withstand voltage, low reverse saturation current, and high on-state current can be obtained. Note that this embodiment can be implemented in combination with any of the structures described in other embodiments, as appropriate.

Embodiment 3

In this embodiment, a non-linear element whose structure is partly different from that of the non-linear element described in Embodiment 1 will be described. Note that a transistor is used as an example also in this embodiment.

Figure 6A:
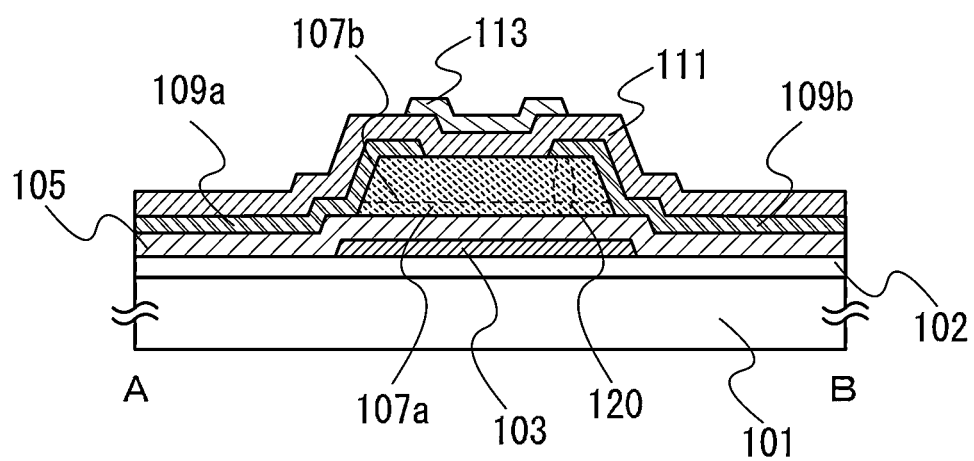
FIGS. 6A and 6B are cross-sectional views illustrating a non-linear element that is one embodiment of the present invention.
Figure 6B:
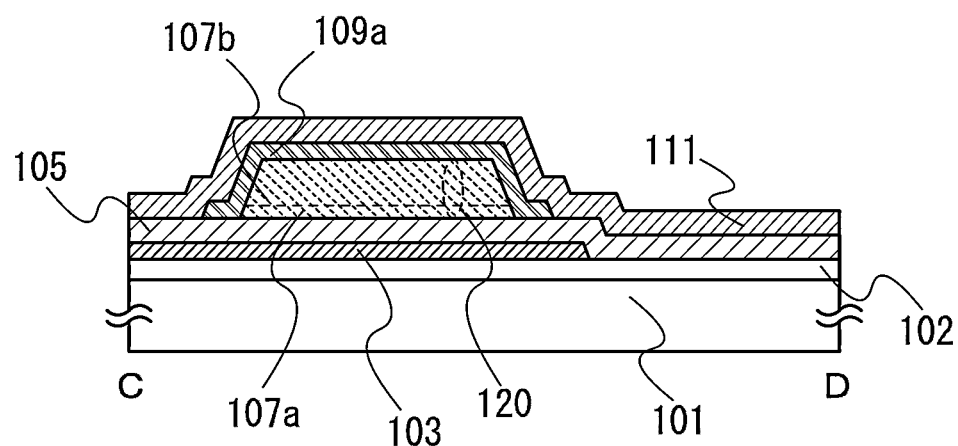

A transistor 300 described in this embodiment is a transistor obtained in such a manner that the oxide semiconductor layer 107 of the transistor 100 described in Embodiment 1 is replaced with a crystalline oxide semiconductor stack 120 including a first crystalline oxide semiconductor layer 107a and a second crystalline oxide semiconductor layer 107b. In short, a plan structure of the transistor 300 is similar to that of the transistor 100; therefore, FIG. 1A can be referred to for the plan view of the transistor 300. FIG. 6A is a cross-sectional view taken along line A-B in the transistor 300. FIG. 6B is a cross-sectional view taken along line C-D in the transistor 300. Note that the transistor 300 is a modified example of the transistor 100; therefore, in FIGS. 6A and 6B, the same reference numerals are used for the same parts as those in FIGS. 1A to 1C, and detailed description of the same reference numerals is omitted.

As illustrated in FIG. 6A, the transistor 300 is a dual-gate transistor and includes a base insulating layer 102, a first electrode 103, a gate insulating layer 105, the crystalline oxide semiconductor stack 120, a pair of second electrodes 109a and 109b, an insulating layer 111, and a third electrode 113, which are provided over a substrate 101.

The first electrode 103 is provided in contact with the base insulating layer 102. The gate insulating layer 105 is provided to cover the first electrode 103. The crystalline oxide semiconductor stack 120 is provided in contact with the gate insulating layer 105 to overlap with the first electrode 103. The pair of second electrodes 109a and 109b cover end portions of the crystalline oxide semiconductor stack 120. The insulating layer 111 covers part of the crystalline oxide semiconductor stack 120 and the pair of second electrodes 109a and 109b. The third electrode 113 is provided on and in contact with the insulating layer 111 and between the pair of second electrodes 109a and 109b.

In addition, since the pair of second electrodes 109a and 109b are provided to cover the end portions of the crystalline oxide semiconductor stack 120, the pair of second electrodes 109a and 109b are in contact with the end surfaces of the crystalline oxide semiconductor stack 120. Therefore, at least in a region where the pair of second electrodes 109a and 109b are in contact with the crystalline oxide semiconductor stack 120, the width of each of the pair of second electrodes 109a and 109b is larger than the width of a channel formed in the crystalline oxide semiconductor stack 120 (see FIG. 1A).

Further, only one of the pair of second electrodes 109a and 109b is illustrated in FIG. 6B. Since the pair of second electrodes 109a and 109b are in contact with the end surfaces of the crystalline oxide semiconductor stack 120, the pair of second electrodes 109a and 109b serve as a heat sink in a manner similar to other embodiments, and when heat is generated due to high on-state current flowing in the crystalline oxide semiconductor stack 120, the pair of second electrodes 109a and 109b can dissipate the heat to the outside. As a result, degradation of the transistor 300 due to heat generation can be suppressed.

Here, the crystalline oxide semiconductor stack 120 is described. The crystalline oxide semiconductor stack 120 has a stacked structure of the first crystalline oxide semiconductor layer 107a and the second crystalline oxide semiconductor layer 107b.

The first crystalline oxide semiconductor layer 107a has c-axis alignment. In addition, the second crystalline oxide semiconductor layer 107b also has c-axis alignment. Note that the first crystalline oxide semiconductor layer 107a and the second crystalline oxide semiconductor layer 107b include an oxide including a crystal with c-axis alignment (also referred to as c-axis aligned crystal (CAAC)), which has neither a single crystal structure nor an amorphous structure.

An oxide including CAAC refers to an oxide including a crystal with c-axis alignment, which has a triangular or hexagonal atomic arrangement when seen from the direction of an a-b plane, a surface, or an interface. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an oxide including CAAC means a non-single-crystal oxide including a phase which has a triangular, hexagonal, regular triangular, or regular hexagonal atomic when seen from the direction perpendicular to the a-b plane and in which metal atoms are arranged in a layered manner or metal atoms and oxygen atoms are arranged in a layered manner when seen from the direction perpendicular to the c-axis.

The CAAC includes a crystalline region (a crystal region) but a boundary between one crystal region and another crystal region is not necessarily clear. That is, the first crystalline oxide semiconductor layer 107a and the second crystalline oxide semiconductor layer 107b partly include a crystal grain boundary.

In the case where oxygen is included in the CAAC, nitrogen may be substituted for part of oxygen included in the CAAC. The c-axes of individual crystalline portions included in the CAAC may be aligned in one direction (e.g., a direction perpendicular to a surface of a substrate over which the CAAC is formed, a surface, a film surface, or an interface of the CAAC). In addition, normals of the a-b planes of individual crystal regions included in the CAAC may be aligned in one direction (e.g., a direction perpendicular to the surface of the substrate over which the CAAC is formed, or the surface, the film surface, or the interface of the CAAC).

The CAAC may be a conductor, a semiconductor, or an insulator depending on its composition or the like. Further, The CAAC may transmit or not transmit visible light depending on its composition or the like.

As an example of such a CAAC, there is a crystal which is formed into a film shape and has a triangular or hexagonal atomic arrangement when observed from the direction perpendicular to a surface of the film or, a surface of a substrate, or an interface and in which metal atoms are arranged in a layered manner or metal atoms and oxygen atoms (or nitrogen atoms) are arranged in a layered manner when a cross section of the film is observed.

The first crystalline oxide semiconductor layer 107a and the second crystalline oxide semiconductor layer 107b are preferably formed using metal oxide containing at least zinc or metal oxide containing at least zinc and indium. For example, among the metal oxides described in Embodiment 1, an In—Sn—Ga—Zn-based metal oxide which is a four-component oxide; an In—Ga—Zn-based metal oxide, an In—Sn—Zn-based metal oxide, an In—Al—Zn-based metal oxide, a Sn—Ga—Zn-based metal oxide, an Al—Ga—Zn-based metal oxide, or a Sn—Al—Zn-based metal oxide, which is a three-component metal oxide; an In—Zn-based metal oxide, a Sn—Zn-based metal oxide, or an Al—Zn-based metal oxide which is a two-component metal oxide; a single-component metal oxide containing Zn; or the like can be used.

The first crystalline oxide semiconductor layer 107a is formed by a sputtering method in which a substrate temperature is higher than or equal to 200° C. and lower than or equal to 400° C., and after the formation, first heat treatment (at a temperature higher than or equal to 400° C. and lower than or equal to 750° C.) is performed.

Figure 7A:
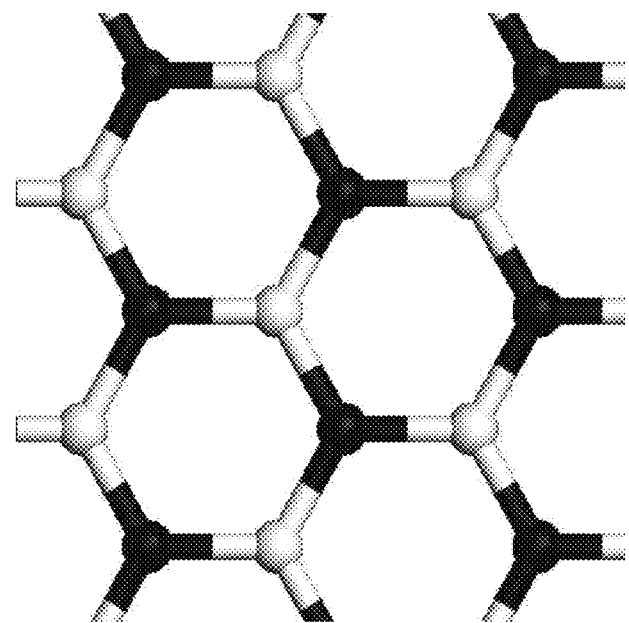
FIGS. 7A and 7B illustrate a two-dimensional crystal.
Figure 7B:
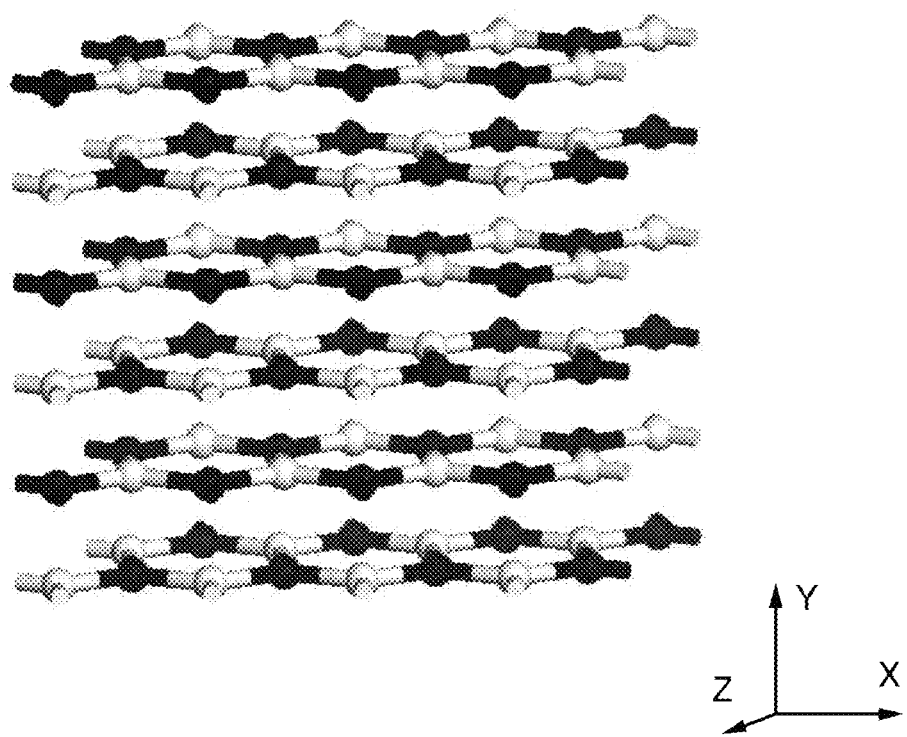

Here, the crystal structure of the CAAC is described. Although depending on the temperature of the first heat treatment, the first heat treatment causes crystallization from a film surface and crystal grows from the film surface toward the inside of the film; thus, a c-axis aligned crystal is obtained. By the first heat treatment, a large amount of zinc and oxygen gather to the film surface, and one or more layers of graphene-type two-dimensional crystal including zinc and oxygen and having a hexagonal upper plane (a schematic plan view thereof is shown in FIG. 7A) are formed at the outermost surface; the layers of crystal at the outermost surface grow in the thickness direction to form a stack of layers. In FIG. 7A, a white circle indicates a zinc atom, and a black circuit indicates an oxygen atom. By increasing the temperature of the heat treatment, crystal growth proceeds from the surface to the inside and further from the inside to the bottom. Further, FIG. 7B schematically shows a stack formed of six layers of two-dimensional crystal as an example of a stack in which two-dimensional crystal has grown.

In the case where oxygen is contained in the gate insulating layer 105, part of oxygen is diffused into an interface between the gate insulating layer 105 and the first crystalline oxide semiconductor layer 107a or the vicinity thereof by the first heat treatment, so that oxygen deficiency of the first crystalline oxide semiconductor layer 107a is reduced. Accordingly, at least oxygen whose amount exceeds the stoichiometric proportion is preferably contained in the film (in the bulk) of the gate insulating layer 105 or the interface between the first crystalline oxide semiconductor layer 107a and the gate insulating layer 105.

The second crystalline oxide semiconductor layer 107b is formed by a sputtering method in which a substrate temperature in deposition is higher than or equal to 200° C. and lower than or equal to 400° C. By setting the substrate temperature in the deposition to be higher than or equal to 200° C. and lower than or equal to 400° C., precursors can be arranged in the oxide semiconductor layer formed on and in contact with the surface of the first crystalline oxide semiconductor layer 107a and so-called orderliness can be obtained. Then, second heat treatment is preferably performed at a temperature higher than or equal to 400° C. and lower than or equal to 750° C. after the formation. The second heat treatment is performed in a nitrogen atmosphere, an oxygen atmosphere, or a mixed atmosphere of nitrogen and oxygen, whereby the density of the second crystalline oxide semiconductor layer 107b can be increased and oxygen deficiency can be reduced. By the second heat treatment, crystal growth proceeds in the thickness direction with the use of the first crystalline oxide semiconductor layer 107a as a nucleus, that is, crystal growth proceeds from the bottom to the inside; thus, the second crystalline oxide semiconductor layer 107b is formed.

In a manner similar to the transistor 100, when the thickness of the crystalline oxide semiconductor stack 120 is large, large current between the source electrode and the drain electrode can be ensured in the transistor 300.

The drain withstand voltage of the transistor 300 depends on the thickness of the crystalline oxide semiconductor stack 120. Therefore, in order to increase the drain withstand voltage, the thickness of the crystalline oxide semiconductor stack 120 is preferably large and may be selected in accordance with the desired drain withstand voltage.

Therefore, considering the amount of the on-state current and the drain withstand voltage, the thickness of the crystalline oxide semiconductor stack 120 is preferably greater than or equal to 0.1 μm and less than or equal to 50 μm, more preferably greater than or equal to 0.5 μm and less than or equal to 20 μm.

Further, the transistor 300 in which the crystalline oxide semiconductor stack 120 includes the channel region has orderliness in a direction along the interface. Therefore, in the transistor 300, in the case where carriers flow along the interface of the crystalline oxide semiconductor stack 120, that is, in the case where carriers flow in a direction substantially parallel to the a-b plane, the crystalline oxide semiconductor stack 120 does not block the flow. Therefore, degradation of the electrical characteristics of the transistor 300 is suppressed even with light irradiation or application of a BT stress.

Without limitation to the two-layer structure in which the second crystalline oxide semiconductor layer 107b is formed over the first crystalline oxide semiconductor layer 107a, a stacked structure including three or more layers may be formed by repeatedly performing a process of deposition and heat treatment for forming a third crystalline oxide semiconductor layer after the second crystalline oxide semiconductor layer 107b is formed.

Steps for manufacturing the transistor 300 are described below. The steps for manufacturing the transistor 300 are the same as those for manufacturing the transistor 100 except a step for manufacturing the crystalline oxide semiconductor stack 120. Therefore, the steps are described with reference to FIGS. 8A to 8D.

Figure 8A:
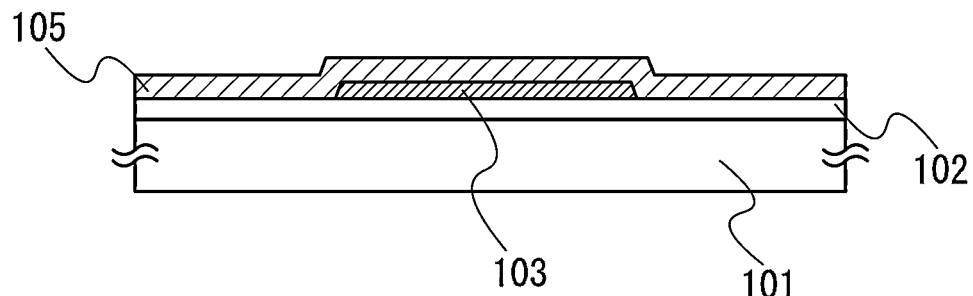
FIGS. 8A to 8D are cross-sectional views illustrating a method for manufacturing a non-linear element that is one embodiment of the present invention.
Figure 8B:
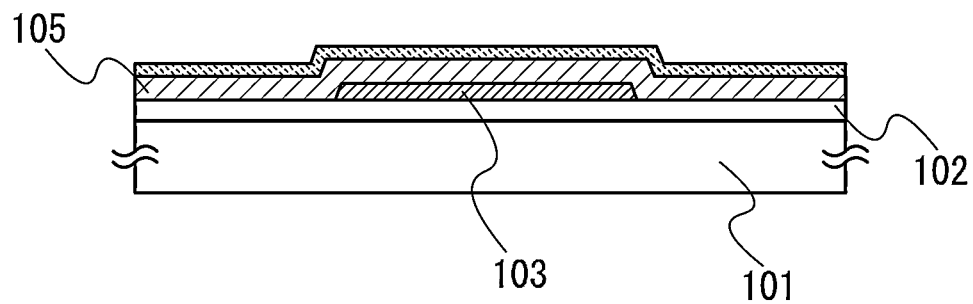
Figure 8C:
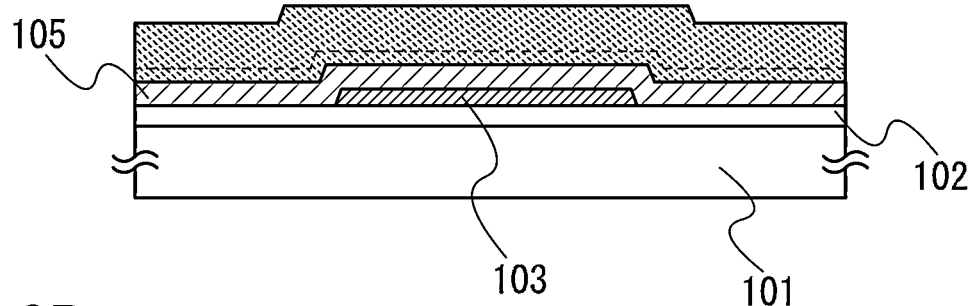

In accordance with the manufacturing steps described in Embodiment 1, steps up to the formation of the gate insulating layer 105 are performed, whereby a structure illustrated in FIG. 8A is obtained.

Next, a first oxide semiconductor film is formed over the gate insulating layer 105. The thickness of the oxide semiconductor film formed is smaller than the thickness of a second oxide semiconductor film which is to be the second crystalline oxide semiconductor layer 107b.

In this embodiment, the first oxide semiconductor film is formed to a thickness of 100 nm in an oxygen atmosphere, an argon atmosphere, or an atmosphere including argon and oxygen under conditions where an In—Ga—Zn-based metal oxide target ($In_2O_3:Ga_2O_3:ZnO=1:1:2$ [molar ratio]) is used, the distance between the substrate and the target is 170 mm, the substrate temperature is 250° C., the pressure is 0.4 Pa, and the direct current (DC) power is 0.5 kW.

Next, the atmosphere in a chamber in which the substrate is put is set to a nitrogen atmosphere or dry air, and first heat treatment is performed. The temperature of the first heat treatment is higher than or equal to 400° C. and lower than or equal to 750° C. In addition, heating time of the first heat treatment is longer than or equal to 1 minute and shorter than or equal to 24 hours. By the first heat treatment, a first crystalline oxide semiconductor film is formed (see FIG. 8B). Details of the first heat treatment are described in Embodiment 1 and thus, are omitted here.

Next, a second oxide semiconductor film which has a large thickness than the first crystalline oxide semiconductor film is formed over the first crystalline oxide semiconductor film.

In this embodiment, the second oxide semiconductor film is formed to a thickness of 400 nm in an oxygen atmosphere, an argon atmosphere, or an atmosphere including argon and oxygen under conditions where an In—Ga—Zn-based metal oxide target ($In_2O_3:Ga_2O_3:ZnO=1:1:2$ [molar ratio]) is used, the distance between the substrate and the target is 170 mm, the substrate temperature is 400° C., the pressure is 0.4 Pa, and the direct current (DC) power is 0.5 kW.

Next, the atmosphere in a chamber in which the substrate is put is set to a nitrogen atmosphere or dry air, and second heat treatment is performed. The temperature of the second heat treatment is higher than or equal to 400° C. and lower than or equal to 750° C.

In addition, heating time of the second heat treatment is longer than or equal to 1 minute and shorter than or equal to 24 hours. By the second heat treatment, the second crystalline oxide semiconductor film is formed (see FIG. 8C). Details of the second heat treatment for forming the second crystalline oxide semiconductor film are similar to those of Embodiment 1. Note that in the drawings, an interface between the first crystalline oxide semiconductor film and the second crystalline oxide semiconductor film is denoted by a dashed line for description of the oxide semiconductor stack; however, the interface is actually not distinct and is illustrated for easy understanding.

When the first heat treatment and the second heat treatment are performed at a temperature higher than 750° C., a crack (a crack extended in the thickness direction) is easily generated in the formed oxide semiconductor film due to shrink of the glass substrate. Accordingly, in the case where the temperatures of the first heat treatment and the second heat treatment and the substrate temperature at the time of forming the oxide semiconductor film by a sputtering method are set to temperatures lower than or equal to 750° C., preferably lower than or equal to 450° C., a highly reliable transistor can be manufactured over a large area glass substrate.

Figure 12:
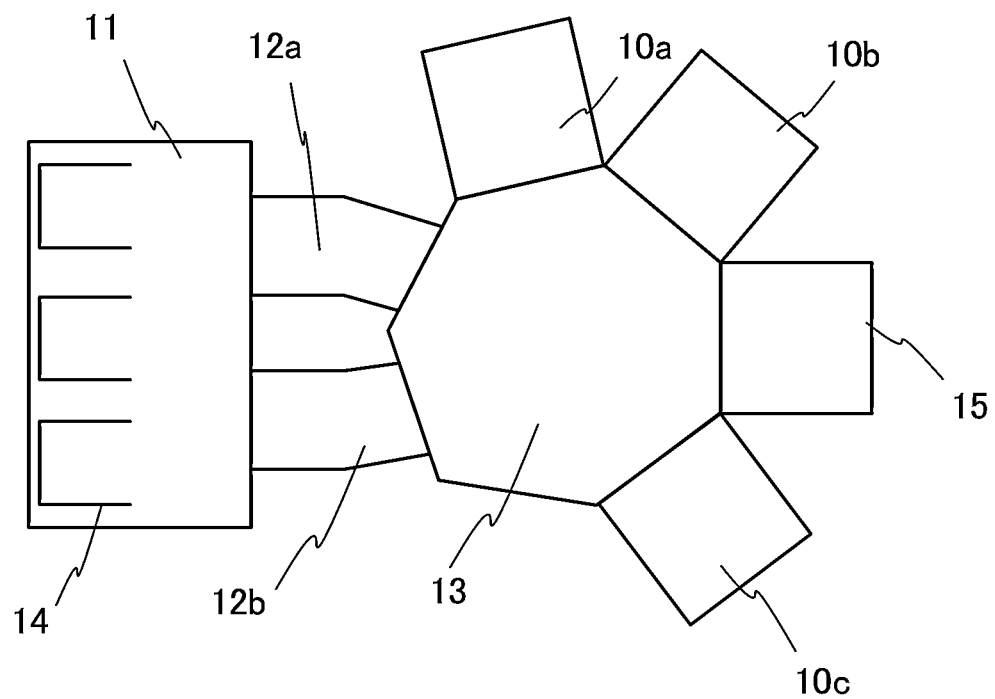
FIG. 12 is a top view of a manufacturing apparatus for manufacturing one embodiment of the present invention.

It is preferable that steps from the formation of the gate insulating layer 105 to the second heat treatment be successively performed without exposure to the air. For example, a manufacturing apparatus whose top view is illustrated in FIG. 12 may be used. The manufacturing apparatus illustrated in FIG. 12 is the single wafer multi-chamber equipment, which includes three sputtering devices 10a, 10b, and 10c, a substrate supply chamber 11 provided with three cassette ports 14 for holding a process substrate, load lock chambers 12a and 12b, a transfer chamber 13, a substrate heating chamber 15, and the like. Note that a transfer robot for transferring a substrate to be treated is provided in each of the substrate supply chamber 11 and the transfer chamber 13. The atmospheres of the sputtering devices 10a, 10b, and 10c, the transfer chamber 13, and the substrate heating chamber 15 are preferably controlled so as to hardly contain hydrogen and moisture (i.e., as an inert atmosphere, a reduced pressure atmosphere, or a dry air atmosphere). For example, a preferable atmosphere is a dry nitrogen atmosphere in which the dew point of moisture is −40° C. or lower, preferably −50° C. or lower. An example of a procedure of the manufacturing steps with use of the manufacturing apparatus illustrated in FIG. 12 is as follows. A process substrate is transferred from the substrate supply chamber 11 to the substrate heating chamber 15 through the load lock chamber 12a and the transfer chamber 13; moisture attached to the process substrate is removed by vacuum baking in the substrate heating chamber 15; the process substrate is transferred to the sputtering device 10c through the transfer chamber 13; and the gate insulating layer 105 is deposited in the sputtering device 10c. Then, the process substrate is transferred to the sputtering device 10a through the transfer chamber 13 without exposure to air, and the first oxide semiconductor film is formed in the sputtering device 10a. Then, the process substrate is transferred to the substrate heating chamber 15 though the transfer chamber 13 without exposure to air and the first heat treatment is performed. Then, the process temperature is transferred to the sputtering device 10b through the transfer chamber 13, and the second oxide semiconductor film is formed in the sputtering device 10b. Then, the process substrate is transferred to the substrate heating chamber 15 through the transfer chamber 13, and the second heat treatment is performed. As described above, with use of the manufacturing apparatus illustrated in FIG. 12, the steps for manufacturing a transistor can proceed without exposure to air. Further, the sputtering device in the manufacturing apparatus in FIG. 12 can achieve a manufacturing process without exposure to air by changing a sputtering target. For example, the following process can be performed. The substrate over which the gate insulating layer 105 is formed in advance is placed in the cassette port 14, and the steps from the formation of the first oxide semiconductor film to the second heat treatment are performed without exposure to air, so that the first crystalline oxide semiconductor film and the second crystalline oxide semiconductor film are formed. After that, in the sputtering device 10c, a conductive film to be the pair of second electrodes 109a and 109b can be formed with use of a metal target over the second crystalline oxide semiconductor film, without exposure to air.

Figure 8D:
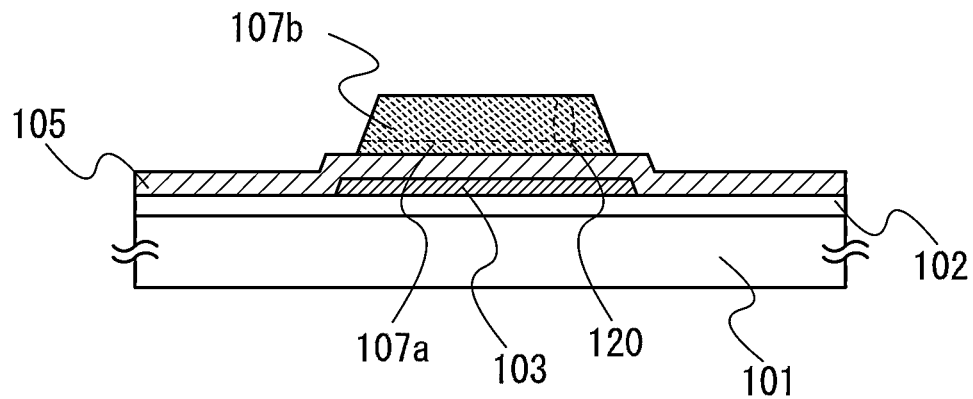

Next, a crystalline oxide semiconductor stack including the first crystalline oxide semiconductor film and the second crystalline oxide semiconductor film is processed, so that the crystalline oxide semiconductor stack 120 in which the first crystalline oxide semiconductor layer 107a and the second crystalline oxide semiconductor layer 107b are stacked is formed (see FIG. 8D).

A mask having a desired shape is formed over the crystalline oxide semiconductor stack and then the crystalline oxide semiconductor stack is etched with the use of the mask to perform the processing of the crystalline oxide semiconductor stack. The mask may be formed by a method such as photolithography or an ink jet method.

For the etching of the crystalline oxide semiconductor stack, either dry etching or wet etching may be employed. It is needless to say that both of them may be employed in combination. Details of the dry etching and the wet etching are similar to those of Embodiment 1.

The subsequent steps are the same as those of Embodiment 1. The pair of second electrodes 109a and 109b are formed, and the insulating layer 111 covering part of the crystalline oxide semiconductor stack 120 and the pair of second electrodes 109a and 109b is formed. Further, the third electrode 113 is formed in contact with the insulating layer 111 so as to overlap with a channel formation region of the crystalline oxide semiconductor stack 120 (see FIG. 6A). Details of the steps are similar to those of Embodiment 1. Note that the step for forming the pair of second electrodes 109a and 109b is combined with a step for forming a wiring 110 (see FIG. 1A), and the step for forming the third electrode 113 is combined with a step for forming a wiring 114 (see FIG. 1A).

Through the above steps, a non-linear element with high withstand voltage, low reverse saturation current, and high on-state current can be obtained. Note that this embodiment can be implemented in combination with any of the structures described in other embodiments, as appropriate.

Embodiment 4

In this embodiment, a non-linear element whose structure is partly different from that of the non-linear element described the above embodiment will be described. Note that a transistor is used as an example also in this embodiment.

Figure 9A:
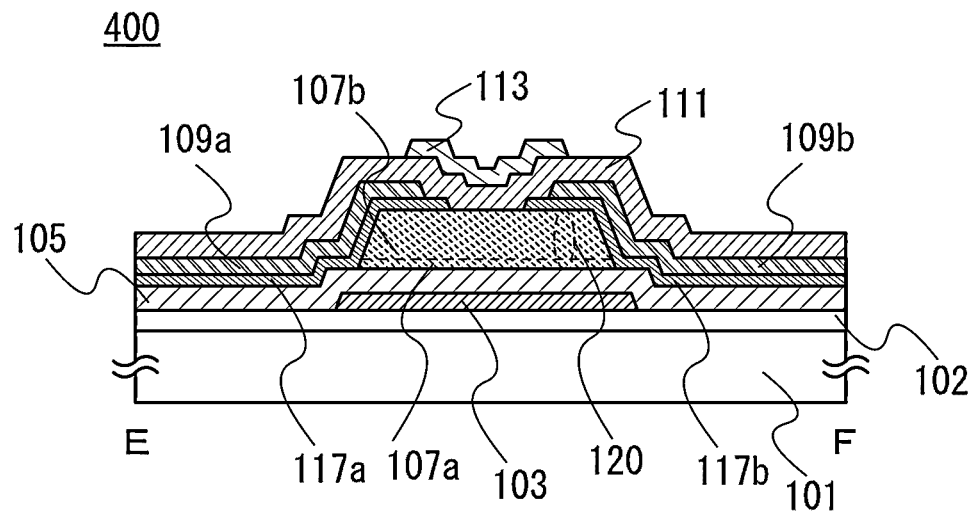
FIGS. 9A and 9B are cross-sectional views illustrating a non-linear element that is one embodiment of the present invention.
Figure 9B:
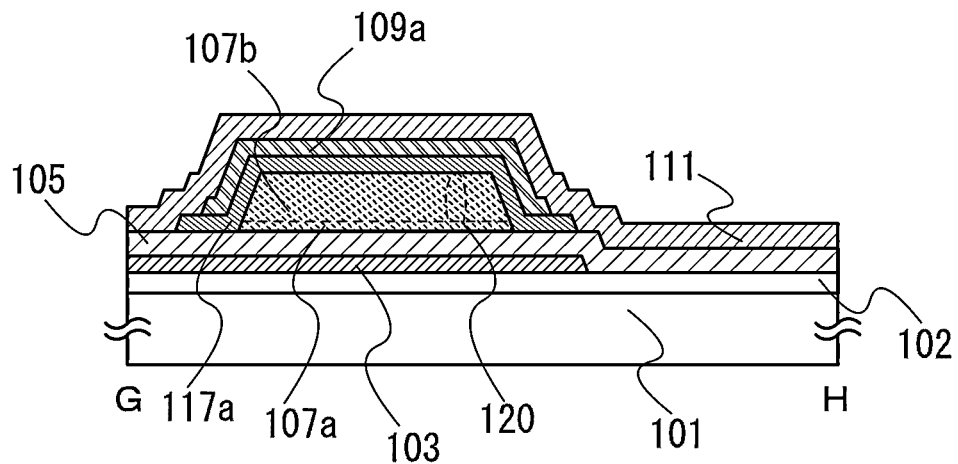

A transistor 400 described in this embodiment is a transistor obtained in such a manner that the oxide semiconductor layer 107 of the transistor 200 described in Embodiment 2 is replaced with a crystalline oxide semiconductor stack 120 including a first crystalline oxide semiconductor layer 107a and a second crystalline oxide semiconductor layer 107b. In short, a plan structure of the transistor 400 is similar to that of the transistor 200; therefore, FIG. 4A can be referred to for the plan view of the transistor 400. FIG. 9A is a cross-sectional view taken along line E-F in the transistor 400 (see FIG. 4A). FIG. 9B is a cross-sectional view taken along line G-H in the transistor 400 (see FIG. 4A). Note that in FIGS. 9A and 9B, the same reference numerals are used for the same parts as those in FIGS. 1A to 1C, and details of the same reference numerals are omitted.

As illustrated in FIG. 9B, the transistor 400 is a dual-gate transistor and includes a base insulating layer 102, a first electrode 103, a gate insulating layer 105, a crystalline oxide semiconductor stack 120, n+ layers 117a and 117b, a pair of second electrodes 109a and 109b, an insulating layer 111, and a third electrode 113, which are provided over a substrate 101.

The first electrode 103 is provided in contact with the base insulating layer 102. The gate insulating layer 105 is provided to cover the first electrode 103. The crystalline oxide semiconductor stack 120 is provided in contact with the gate insulating layer 105 to overlap with the first electrode 103. The n+ layers 117a and 117b cover the gate insulating layer 105 and end portions of the crystalline oxide semiconductor stack 120. The pair of second electrodes 109a and 109b cover the end portions of the crystalline oxide semiconductor stack 120 and end portions of the n+ layers 117a and 117b. The insulating layer 111 covers part of the crystalline oxide semiconductor stack 120 and the pair of second electrodes 109a and 109b. The third electrode 113 is provided on and in contact with the insulating layer 111 and between the pair of second electrodes 109a and 109b.

The n+ layers 117a and 117b are formed between the crystalline oxide semiconductor stack 120 and the pair of second electrodes 109a and 109b, whereby contact resistance between the crystalline oxide semiconductor stack 120 and the pair of second electrodes 109a and 109b can be reduced. As a result, high on-state current can be obtained. In addition, when the n+ layers 117a and 117b are formed, parasitic capacitance can be reduced and the amount of change in on-state current (Ion degradation) between before and after application of a negative gate stress in a BT test can be suppressed.

Although only one of the pair of second electrodes 109a and 109b is illustrated in FIG. 1C, an etching step is performed using the pair of second electrodes 109a and 109b as masks to form the n+ layers 117a and 117b, and thus the n+ layers 117a and 117b are processed so that the end portions of the n+ layers 117a and 117b protrude from the pair of second electrodes 109a and 109b. Thus, the channel length of the transistor 400 is determined by the distance between the n+ layer 117a and the n+ layer 117b. Although the pair of second electrodes 109a and 109b face the crystalline oxide semiconductor stack 120 with the n+ layers 117a and 117b provided therebetween, the pair of second electrodes 109a and 109b serve as a heat sink in a manner similar to other embodiments because the n+ layers 117a and 117b are not formed to be extremely thick and do not block the conduction of heat generated in the crystalline oxide semiconductor stack 120. As a result, heat which is generated when high on-state current flows in the crystalline oxide semiconductor stack 120 can be dissipated to the outside, so that degradation of the transistor 400 due to heat generation can be suppressed.

The crystalline oxide semiconductor stack 120 has a stacked structure of the first crystalline oxide semiconductor layer 107a and the second crystalline oxide semiconductor layer 107b. Details of the first crystalline oxide semiconductor layer 107a and the second crystalline oxide semiconductor layer 107b are similar to those of Embodiment 3. In the transistor 400 described in this embodiment, at least part of the first crystalline oxide semiconductor layer 107a and part of the second crystalline oxide semiconductor layer 107b are crystallized and have c-axis alignment, and the crystalline oxide semiconductor stack 120 has orderliness in a direction along the interface between the crystalline oxide semiconductor stack 120 and the gate insulating layer. Therefore, in the case where carriers flow along the interface, the crystalline oxide semiconductor stack 120 does not block the flow. Therefore, degradation of the electrical characteristics of the transistor 400 is suppressed even with light irradiation or application of a BT stress.

Steps for manufacturing the transistor 400 are described below. The steps for manufacturing the transistor 400 are the same as those for manufacturing the transistor 200 except a step for manufacturing the crystalline oxide semiconductor stack 120. Therefore, the steps are described with reference to FIGS. 5A to 5C and FIGS. 8A to 8D.

In accordance with the manufacturing steps described in Embodiment 1 and Embodiment 3, steps up to the formation of the crystalline oxide semiconductor stack 120 are performed, whereby a structure illustrated in FIG. 8D is obtained.

Next, the film 115 to be the n+ layers 117a and 117b is formed to a thickness greater than or equal to 1 nm and less than or equal to 200 nm over the gate insulating layer 105 and the crystalline oxide semiconductor stack 120 with the use of an In—Zn-based metal oxide, an In—Sn-based metal oxide, or a single-component metal oxide containing indium or tin. The method for forming the film 115 is similar to that of Embodiment 2. In addition, $SiO_2$ may be contained in the above material for the n+ layers. In this embodiment, an In—Sn-based metal oxide film containing $SiO_2$ is formed to a thickness of 100 nm.

Next, a conductive film for forming the pair of second electrodes 109a and 109b is formed over the film 115 which is to be the n+ layers (see FIG. 5A). The conductive film is processed to form the pair of second electrodes 109a and 109b. Note that the step for forming the pair of second electrodes 109a and 109b is combined with a step for forming a wiring 110 (see FIG. 4A).

Then, the film 115 is processed using the pair of second electrodes 109a and 109b as masks to form the n+ layers 117a and 117b. Through this processing, the n+ layers 117a and 117b are formed so that the end portions thereof protrude from the pair of second electrodes 109a and 109b (see FIG. 5B). Thus, the channel length of the transistor 400 is determined by the distance between the n+ layer 117a and the n+ layer 117b. On the other hand, the channel length of the transistor 300 described in Embodiment 3 is determined by the distance between the pair of second electrodes 109a and 109b. It is preferable that the taper angle of each of the end portions of the n+ layers 117a and 117b (an angle formed by the side surface of either the n+ layer 117a or the n+ layers 117b and a planar surface of the substrate 101) be less than or equal to 30°.

The subsequent steps are the same as those of Embodiment 2. The insulating layer 111 covering part of the crystalline oxide semiconductor stack 120 and the pair of second electrodes 109a and 109b is formed. Further, the third electrode 113 is formed in contact with the insulating layer 111 so as to overlap with a channel formation region of the crystalline oxide semiconductor stack 120 (see FIG. 9A). Note that the step for forming the third electrode 113 is combined with a step for forming a wiring 114 (see FIG. 4A), and details of the steps are the same as those of Embodiment 2.

Through the above steps, a non-linear element with high withstand voltage, low reverse saturation current, and high on-state current can be obtained. Note that this embodiment can be implemented in combination with any of the structures described in other embodiments, as appropriate.

Embodiment 5

In this embodiment, calculation results of on-state currents of non-linear elements will be described. Note that calculation is performed on simplified structures of the non-linear elements. Further, Sentaurus Device manufactured by Synopsys Inc. is used in the calculation.

First, a calculation result of a change in a drain current with respect to a change in a gate voltage is described.

Figure 13A:
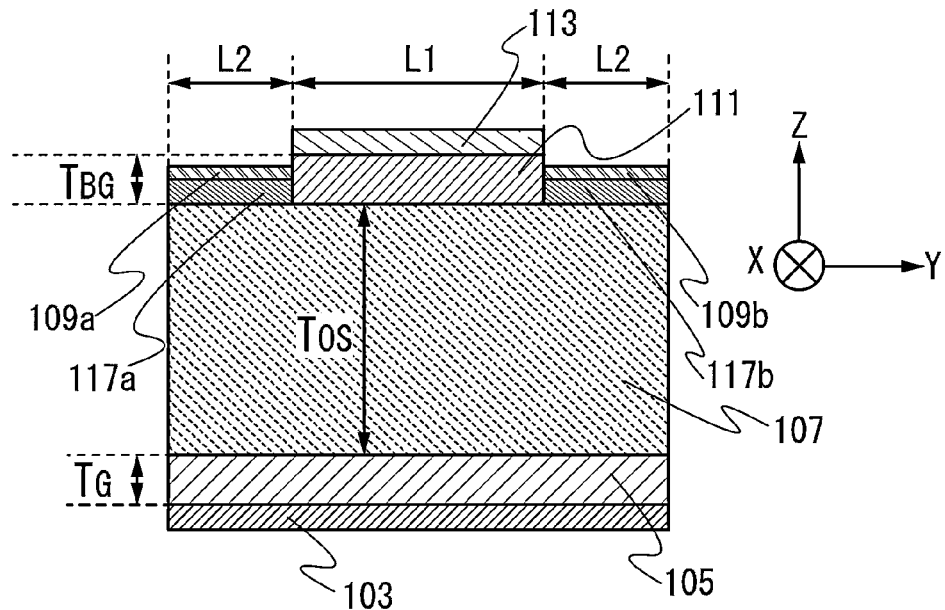
FIGS. 13A to 13C are cross-sectional views illustrating a structure of a non-linear element used for calculation.
Figure 13B:
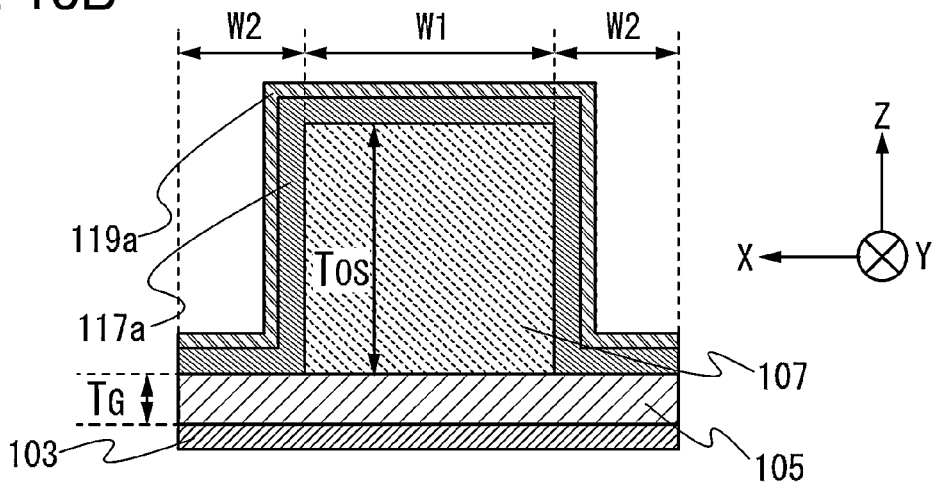
Figure 13C:
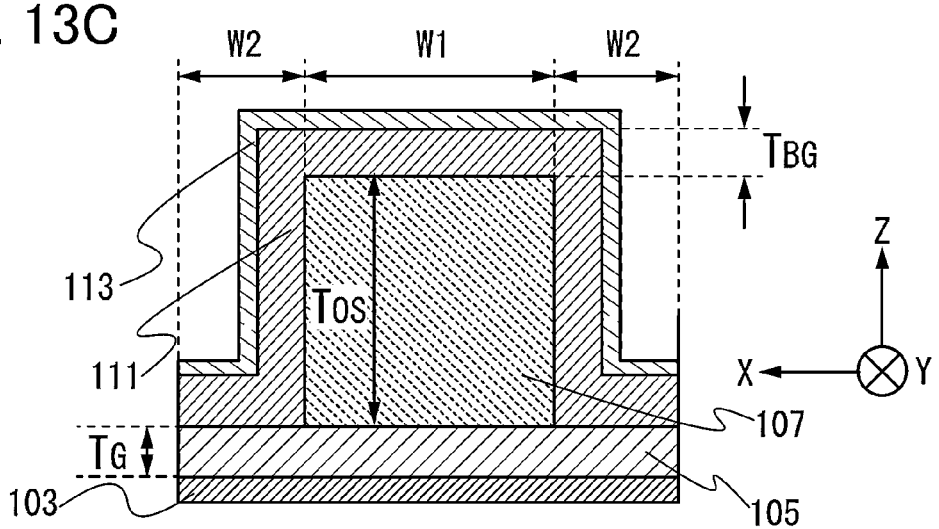

FIG. 13A is a simplified view of a cross-sectional structure (Structure 1) along the channel length direction in the transistor 200 described in Embodiment 2 (a cross-sectional structure taken along line E-F in FIG. 4A). FIG. 13B is a simplified view of a cross-sectional structure taken along line G-H in FIG. 4A. FIG. 13C is a simplified view of a cross-sectional structure along a direction perpendicular to the line E-F in a channel formation region of the transistor 200. Note that components of FIGS. 13A to 13C corresponding to those of FIGS. 4A to 4C are denoted by the same numerals as those of FIGS. 4A to 4C.

Parameters reflected on the calculation result of on-state current in the structure of FIGS. 13A to 13C are as follows:

1. Channel length L1: 10 μm
2. Length L2 of the pair of second electrodes 109a and 109b: 5 μm
3. Thickness $T_{os}$ of the oxide semiconductor layer 107: 10 μm
4. Thickness $T_G$ of the gate insulating layer 105 and the thickness $T_{BG}$ of the insulating layer 111: 0.2 μm
5. Channel width W1: 100 μm
6. Width W2 of the pair of second electrodes 109a and 109b: 5 μm
7. Work function φM of tungsten used for the first electrode 103: 4.9 eV
8. Work function φM of titanium used for the pair of second electrodes 109a and 109b: 4.0 eV
9. Work function φM of molybdenum used for the third electrode 113: 4.8 eV
10. Band gap Eg, electron affinity χ, relative permittivity, and electron mobility of In—Ga—Zn—O-based metal oxide used for the oxide semiconductor layer 107: 3.15 eV, 4.3 eV, 15, and 10 cm²/Vs
11. Relative permittivity of silicon oxynitride used for the gate insulating layer 105: 4.1
12. Relative permittivity of silicon oxide used for the insulating layer 111: 3.8

Note that the calculation is performed on the assumption that the first electrode 103, the pair of second electrodes 109a and 109b, the third electrode 113, and the n⁺ layers 117a and 117b have the same potential regardless of their thicknesses, and thus, the calculation results do not reflect the thicknesses.

Figure 14:
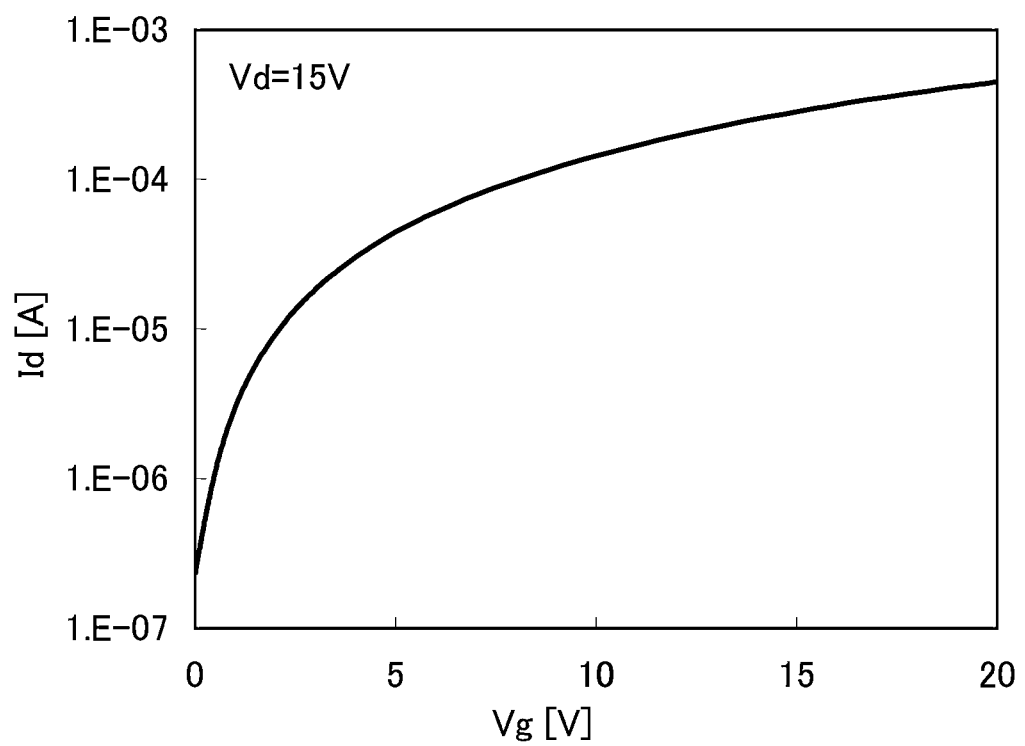
FIG. 14 is a graph showing a calculation result of a drain current in the non-linear element illustrated in FIGS. 13A to 13C.

FIG. 14 shows the calculation result of the drain current (Id) where the drain voltage is 15 V and the gate voltage varies from 0 V to 20 V. As found from FIG. 14, the non-linear element in which the end portions of the oxide semiconductor layer 107 are covered with the n⁺ layers 117a and 117b and the pair of second electrodes 109a and 109b can have high on-state current.

Next, a calculation result of a change in the drain current with respect to a change in the drain voltage in Structure 1 is described. Comparative examples are Structure 2 to Structure 4, which are described below.

Figure 15A:
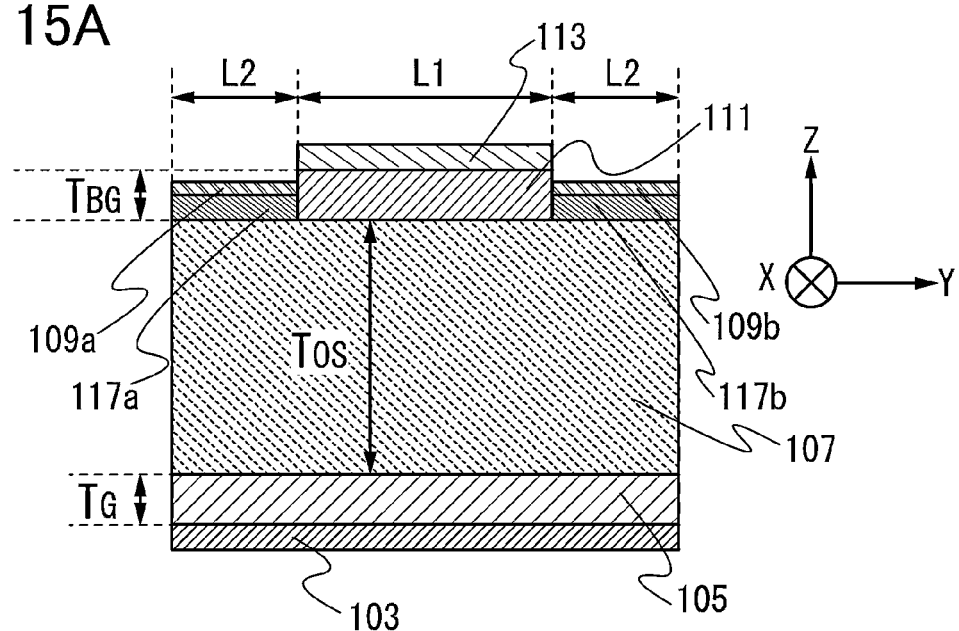
FIGS. 15A to 15C are cross-sectional views illustrating a structure of a non-linear element used for calculation as a comparative example.
Figure 15B:
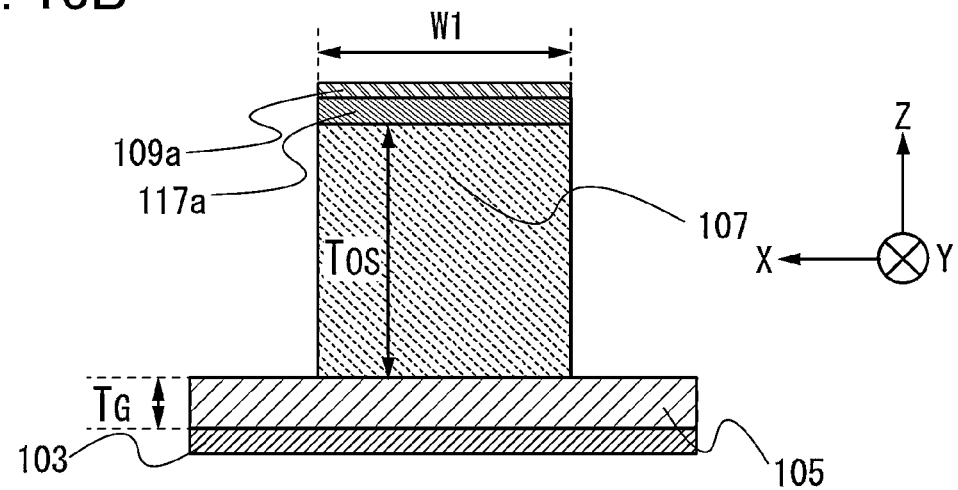
Figure 15C:
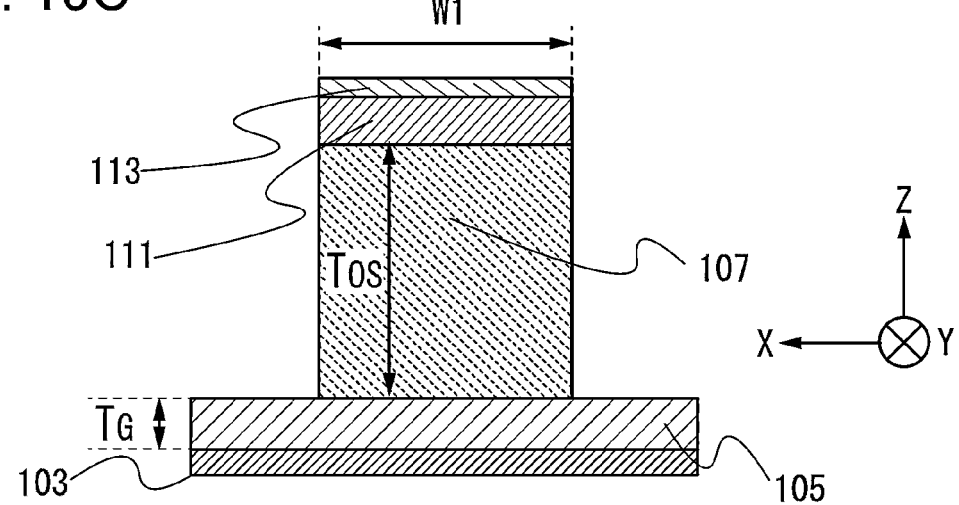

Structure 2 is a structure of the transistor 200 (see FIGS. 15A to 15C), in which the pair of second electrodes 109a and 109b, the n⁺ layers 117a and 117b, and the third electrode 113 are not in contact with the side surfaces of the oxide semiconductor layer 107. As for Structure 2, FIG. 15A is a view simplified in the same manner as FIG. 13A. FIG. 15B is a view simplified in the same manner as FIG. 13B. FIG. 15C corresponds to the structure of FIG. 13C.

Figure 16A:
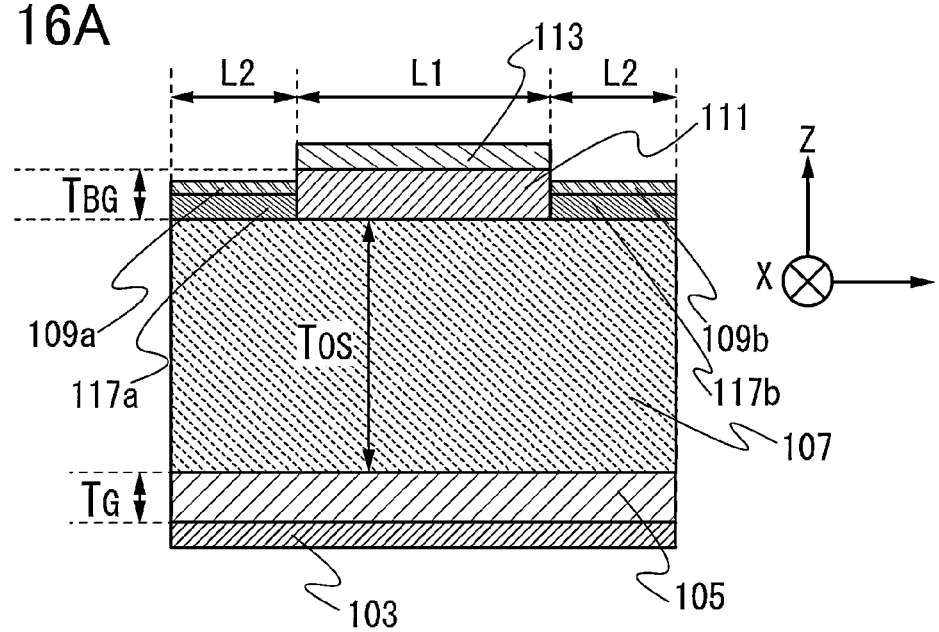
FIGS. 16A to 16C are cross-sectional views illustrating a structure of a non-linear element used for calculation as a comparative example.
Figure 16B:
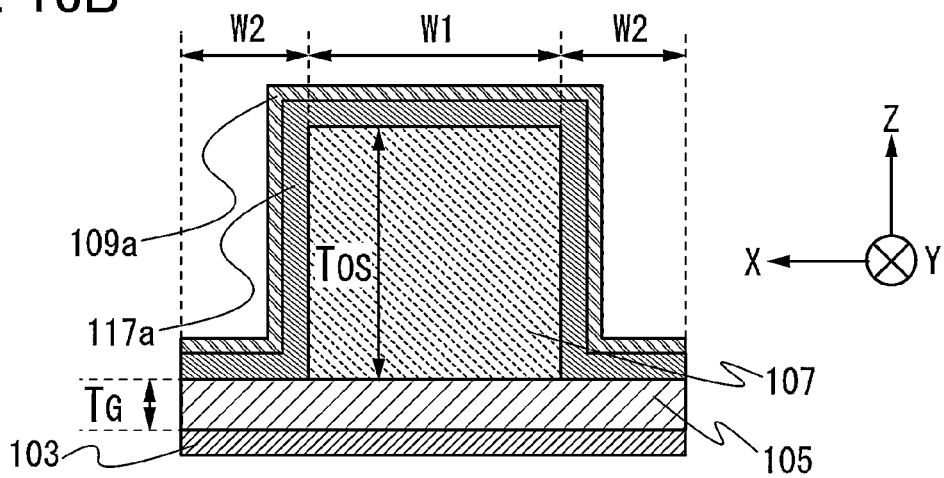
Figure 16C:
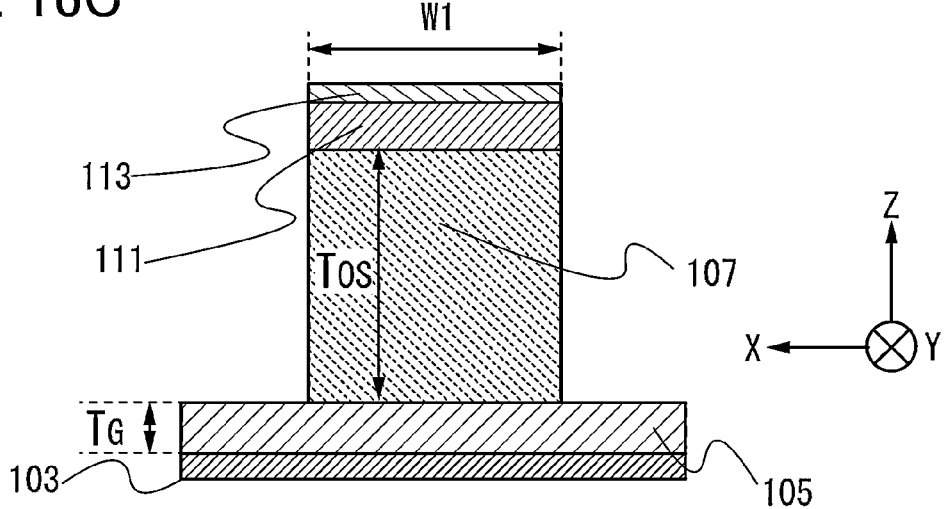

Structure 3 is a structure (see FIGS. 16A to 16C) in which the pair of second electrodes 109a and 109b and the n⁺ layers 117a and 117b are in contact with the side surfaces of the oxide semiconductor layer 107, and the third electrode 113 is not in contact with the side surfaces of the oxide semiconductor layer 107. As for Structure 3, FIG. 16A is a view simplified in the same manner as FIG. 13A. FIG. 16B is a view simplified in the same manner as FIG. 13B. FIG. 16C corresponds to the structure of FIG. 13C.

Figure 17A:
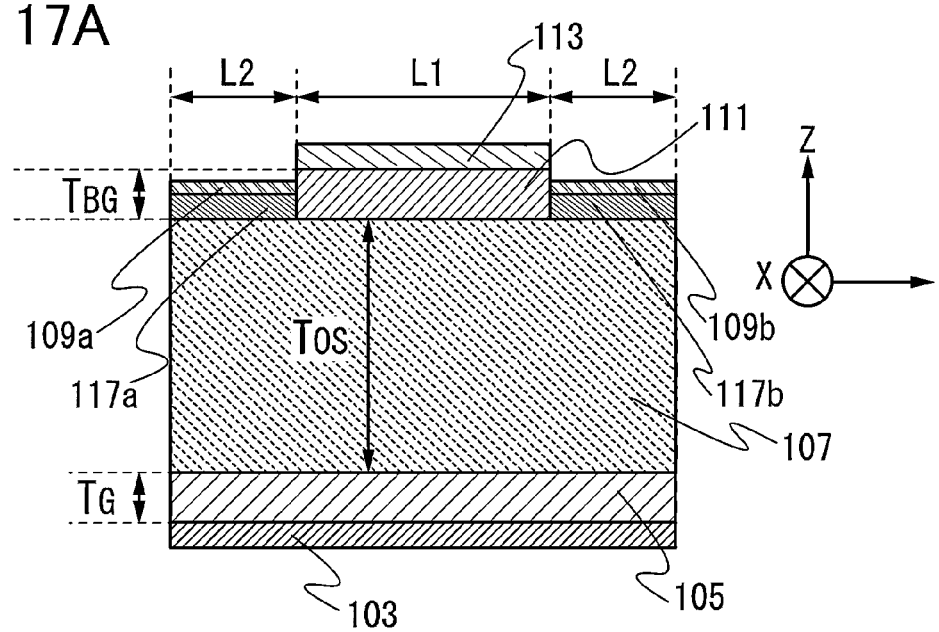
FIGS. 17A to 17C are cross-sectional views illustrating a structure of a non-linear element used for calculation as a comparative example.
Figure 17B:
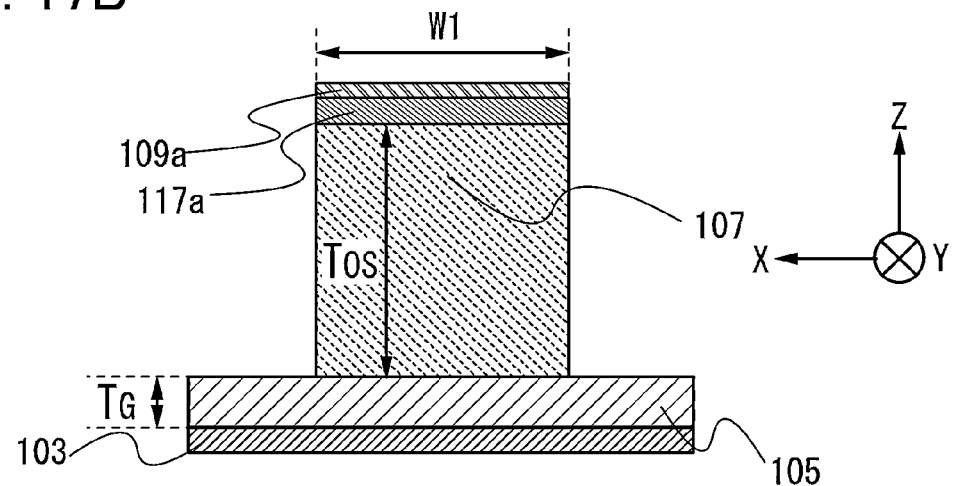
Figure 17C:
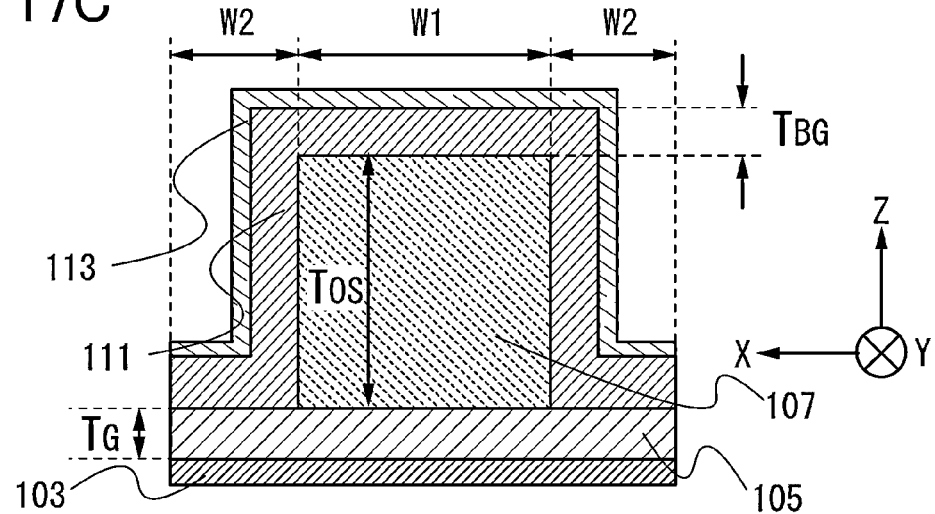

Structure 4 is a structure (see FIGS. 17A to 17C) in which the pair of second electrodes 109a and 109b and the n⁺ layers 117a and 117b are not in contact with the side surfaces of the oxide semiconductor layer 107, and the third electrode 113 is in contact with the side surfaces of the oxide semiconductor layer 107. As for Structure 4, FIG. 17A is a view simplified in the same manner as FIG. 13A. FIG. 17B is a view simplified in the same manner as FIG. 13B. FIG. 17C is a view simplified in the same manner as FIG. 13C.

Parameters of Structure 2 to Structure 4 which are reflected in calculation results are the same as those of Structure 1. Note that the calculation is performed on the assumption that the first electrode 103, the pair of second electrodes 109a and 109b, the third electrode 113, and the n⁺ layers 117a and 117b have the same potential regardless of their thicknesses, and thus, the calculation results do not reflect the thicknesses.

Figure 18:
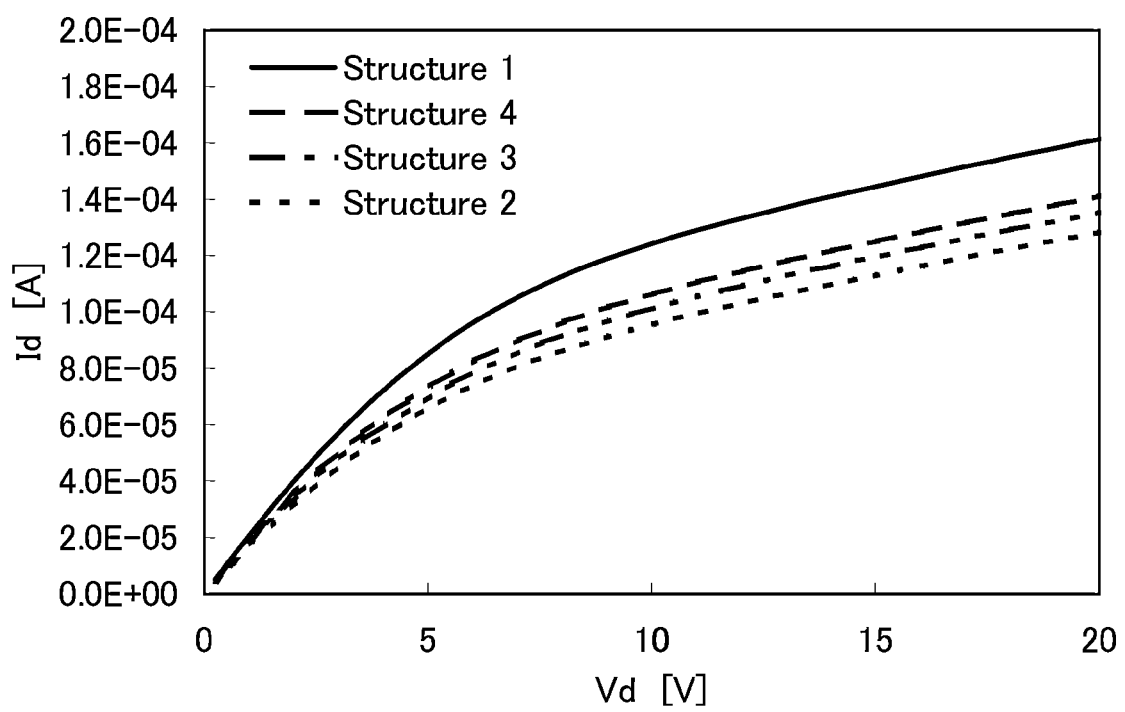
FIG. 18 is a graph showing calculation results of drain currents in the non-linear elements of FIGS. 13A to 13C and FIGS. 15A to 17C.

The calculation results of the on-state currents of Structure 1 to Structure 4 are shown in FIG. 18. FIG. 18 shows the calculation results of drain currents (Id) corresponding to drain voltages, where the gate voltage (Vg) is 10 V and the drain voltages (Vd) vary from 0 V to 20 V.

As shown in FIG. 18, the drain current of Structure 1 is higher than any of the drain currents of Structure 2 to Structure 4. In other words, a structure like Structure 1 in which the pair of second electrodes 109a and 109b, the n⁺ layers 117a and 117b, and the third electrode 113 are in contact with the side surfaces of the oxide semiconductor layer 107 is employed, carriers can be efficiently injected into the oxide semiconductor layer 107 that includes the channel formation region and high on-state current can be obtained, which is favorable to a non-linear element for large current application.

This embodiment can be implemented in appropriate combination with any of the structures described in the other embodiments.

Embodiment 6

In this embodiment, examples of a power diode and a rectifier with the use of a non-linear element that is one embodiment of the present invention will be described with reference to FIG. 10A1 to 10C2 and FIGS. 11A and 11B.

FIG. 10A1 illustrates an example of a structure of a power diode that is one embodiment of the present invention. In a power diode illustrated in FIG. 10A1, a plurality of diodes are connected in series.

FIG. 10B1 illustrates an example of a structure of a rectifier that is one embodiment of the present invention. The rectifier illustrated in FIG. 10B1 is a half-wave rectifier including two diodes. An anode of a first diode is connected to a lower potential side reference potential (preferably, a ground potential). A cathode of the first diode is connected to an input portion and an anode of a second diode. A cathode of the second diode is connected to an output portion.

FIG. 10C1 illustrates an example of a structure of a rectifier that is one embodiment of the present invention. The rectifier illustrated in FIG. 10C1 is a full-wave rectifier including four diodes. The four diodes are referred to as first to fourth diodes clockwise from the diode on the upper left. Anodes of the first diode and the fourth diode are connected to a reference potential (preferably a ground potential) on the lower potential side. A cathode of the first diode and an anode of the second diode are connected to a first input portion. An anode of the third diode and a cathode of the fourth diode are connected to a second input portion. A cathode of the second diode and a cathode of the third diode are connected to an output portion.

Figure 11A:
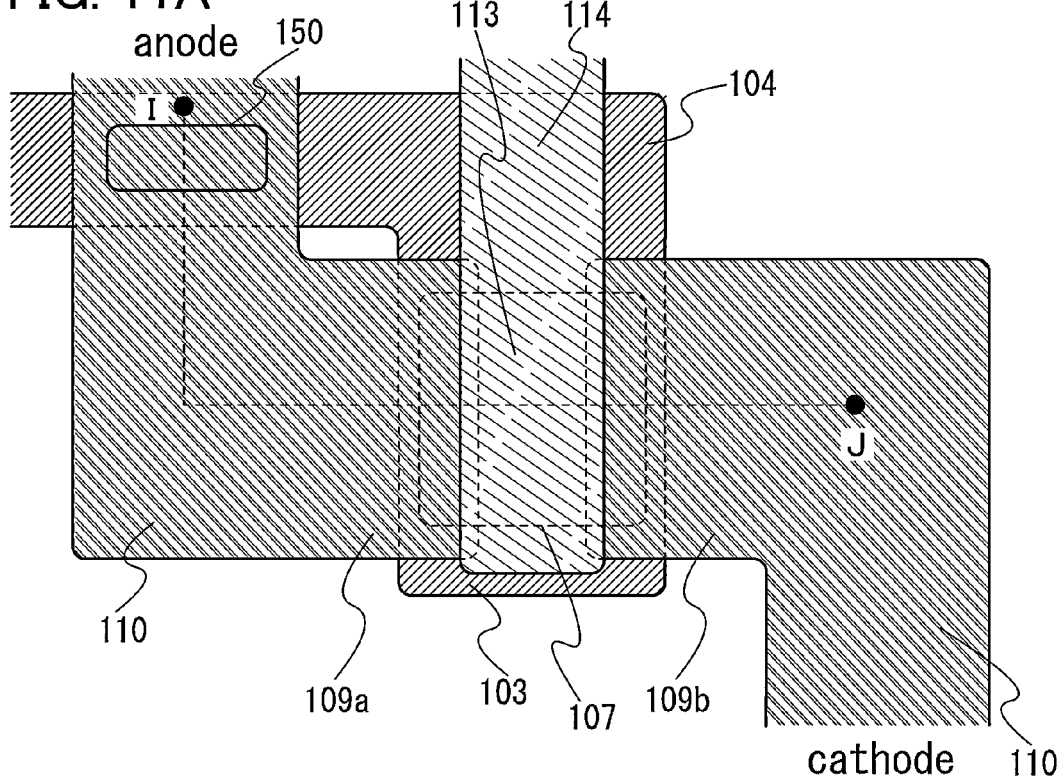
FIGS. 11A and 11B are a plan view and a cross-sectional view illustrating a diode that is one embodiment of the present invention.
Figure 11B:
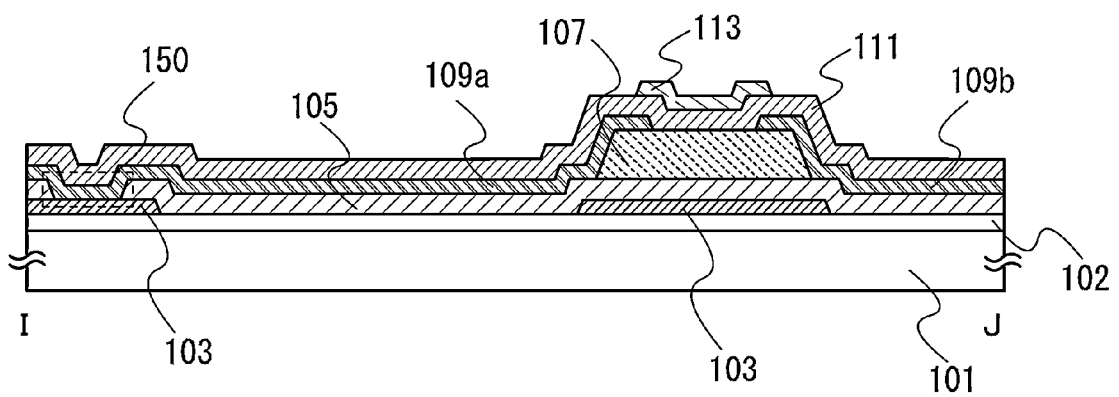

As the diodes used in the power diode, the half-wave rectifier, and the full-wave rectifier, non-linear elements described in the above embodiment, in each of which one of the pair of second electrodes 109a and 109b which functions as the source electrode or the drain electrode is electrically connected (diode-connected) to the first electrode 103 functioning as the gate electrode can be used (see FIGS. 11A and 11B). In the case where the non-linear element described in the above embodiment is an n-type non-linear element, electrodes with diode connection are an anode and an electrode without diode connection is a cathode.

FIG. 11A is a plan view of the diode-connected non-linear element. FIG. 11B is a cross-sectional view taken along line I-J in FIG. 11A. As illustrated in FIG. 11B, a wiring 110 including the pair of second electrodes 109a and 109b is electrically connected to a wiring 104 including the first electrode 103 through an opening portion 150. Note that although the transistor 100 described in Embodiment 1 is used in this embodiment, the transistor of any of Embodiment 2 to Embodiment 4 can also have a diode connection.

The power diode of FIG. 10A1 can have a structure illustrated in FIG. 10A2 with the use of diode-connected transistors. The half-wave rectifier of FIG. 10B1 can have a structure illustrated in FIG. 10B2 with the use of diode-connected transistors. The full-wave rectifier of FIG. 10C1 can have a structure illustrated in FIG. 10C2 with the use of diode-connected transistors.

In FIG. 10A2, the transistors included in the power diode, which are dual-gate transistors, each include a third electrode 113 (including a wiring 114) (see FIGS. 11A and 11B). The third electrodes 113 to which control signals G1 to G5 are supplied control threshold voltages of the respective diode-connected transistors. Also in FIGS. 10B2 and 10C2, since every transistor includes the third electrode 113, the threshold voltages of the diode-connected transistors can be controlled by the control signals G1 to G4. For example, in view of reliability as described in the above embodiment, the electrical characteristics of a transistor including an oxide semiconductor vary by irradiation with visible light and ultraviolet light or application of heat or an electric field. For example, a transistor becomes normally-on. Further in the case where the half-wave rectifier and the full-wave rectifier are formed using n-channel transistors, when the n-channel transistors become normally-on, current flows in the half-wave rectifier and the full-wave rectifier even when a reverse bias is applied thereto, whereby a normal rectification action cannot be obtained. Thus, negative potential is applied to the third electrodes 113 functioning as back gate electrodes of the transistors included in the half-wave rectifier and the full-wave rectifier, which prevents the transistors from becoming normally-on and reduces reverse current, so that a favorable rectification action can be obtained.

Note that in this embodiment, the third electrodes 113 of the transistors included in the power diode and the rectifier are supplied with respective control signals; however, the third electrodes 113 may be connected to each other and the transistors included in the power diode and the rectifier may be supplied with the same signals. Further, in the drawings, "OS" written in the vicinity of a circuit symbol of the transistor included in the power diode and the rectifier indicates that the transistor includes an oxide semiconductor layer.

Further, an oxide semiconductor can be used in the transistors included in the power diode and the rectifier described in this embodiment. Therefore, according to any of the above embodiments, a power diode and a rectifier having excellent drain withstand voltage and high drain current can be obtained.

Through the above steps, a non-linear element with characteristics such as high withstand voltage and low reverse saturation current, which can have high on-state current can be obtained. Note that this embodiment can be implemented in combination with any of the structures described in other embodiments, as appropriate.

This application is based on Japanese Patent Application serial no. 2010-204693 filed with Japan Patent Office on Sep. 13, 2010, the entire contents of which are hereby incorporated by reference.

What is claimed is:

1. A semiconductor device comprising a transistor, the transistor comprising:
   a first gate electrode over a substrate;
   a first gate insulating layer over the first gate electrode;
   an oxide semiconductor layer over the first gate insulating layer;
   a source electrode and a drain electrode over the oxide semiconductor layer;
   a second gate insulating layer over the source electrode and the drain electrode;
   a second gate electrode over the second gate insulating layer,
   wherein the oxide semiconductor layer is located between the first gate electrode and the second gate electrode,
   wherein the oxide semiconductor layer comprises a first side surface along a channel length direction, a second side surface opposed to the first side surface, a third side surface along a channel width direction, and a fourth side surface opposed to the third side surface,
   wherein the source electrode is in contact with the first, second, and third side surfaces of the oxide semiconductor layer,
   wherein the drain electrode is in contact with the first, second, and fourth side surfaces of the oxide semiconductor layer, and
   wherein the second gate electrode extends beyond the oxide semiconductor layer along the channel width direction.

2. The semiconductor device according to claim 1, wherein the first gate electrode is electrically connected to one of the source electrode and the drain electrode.

3. The semiconductor device according to claim 1, wherein the oxide semiconductor layer is a crystalline oxide semiconductor layer.

4. The semiconductor device according to claim 1, wherein the oxide semiconductor layer comprises indium, gallium, and zinc.

5. The semiconductor device according to claim 1, wherein a thickness of the oxide semiconductor layer is greater than or equal to 0.1 μm and less than or equal to 50 μm.

6. The semiconductor device according to claim 1, wherein an off-state current per micrometer of a channel width of the transistor is 100 zA or less at room temperature.

7. The semiconductor device according to claim 1,
wherein a length of the oxide semiconductor layer is smaller than a length of the first gate electrode in the channel length direction, and
wherein a length of the oxide semiconductor layer is larger than a length of the second gate electrode in the channel length direction.

8. The semiconductor device according to claim 1,
wherein the second gate electrode comprises a first region and a second region opposed to the first region in the channel width direction,
wherein the first region of the second gate electrode is opposed to the first side surface of the oxide semiconductor layer with the second gate insulating layer interposed therebetween, and
wherein the second region of the second gate electrode is opposed to the second side surface of the oxide semiconductor layer with the second gate insulating layer interposed therebetween.

9. A semiconductor device comprising a transistor, the transistor comprising:
a first gate electrode over a substrate;
a first gate insulating layer over the first gate electrode;
an oxide semiconductor layer over the first gate insulating layer, the oxide semiconductor layer comprising a first layer and a second layer;
a source electrode and a drain electrode over the oxide semiconductor layer;
a second gate insulating layer over the source electrode and the drain electrode;
a second gate electrode over the second gate insulating layer,
wherein the oxide semiconductor layer is located between the first gate electrode and the second gate electrode,
wherein the oxide semiconductor layer comprises a first side surface along a channel length direction, a second side surface opposed to the first side surface, a third side surface along a channel width direction, and a fourth side surface opposed to the third side surface,
wherein the source electrode is in contact with the first, second, and third side surfaces of the oxide semiconductor layer,
wherein the drain electrode is in contact with the first, second, and fourth side surfaces of the oxide semiconductor layer, and
wherein the second gate electrode extends beyond the oxide semiconductor layer along the channel width direction.

10. The semiconductor device according to claim 9, wherein the first gate electrode is electrically connected to one of the source electrode and the drain electrode.

11. The semiconductor device according to claim 9,
wherein the first layer is a first crystalline oxide semiconductor layer, and
wherein the second layer is a second crystalline oxide semiconductor layer.

12. The semiconductor device according to claim 9, wherein the oxide semiconductor layer comprises indium, gallium, and zinc.

13. The semiconductor device according to claim 9, wherein a thickness of the oxide semiconductor layer is greater than or equal to 0.1 μm and less than or equal to 50 μm.

14. The semiconductor device according to claim 9, wherein an off-state current per micrometer of a channel width of the transistor is 100 zA or less at room temperature.

15. The semiconductor device according to claim 9,
wherein a length of the oxide semiconductor layer is smaller than a length of the first gate electrode in the channel length direction, and
wherein a length of the oxide semiconductor layer is larger than a length of the second gate electrode in the channel length direction.

16. The semiconductor device according to claim 9,
wherein the second gate electrode comprises a first region and a second region opposed to the first region in the channel width direction,
wherein the first region of the second gate electrode is opposed to the first side surface of the oxide semiconductor layer with the second gate insulating layer interposed therebetween, and
wherein the second region of the second gate electrode is opposed to the second side surface of the oxide semiconductor layer with the second gate insulating layer interposed therebetween.

17. A semiconductor device comprising a transistor, the transistor comprising:
a first gate electrode over a substrate;
a first gate insulating layer over the first gate electrode;
an oxide semiconductor layer over the first gate insulating layer;
a source electrode and a drain electrode over the oxide semiconductor layer;
a second gate insulating layer over the source electrode and the drain electrode;
a second gate electrode over the second gate insulating layer,
wherein the oxide semiconductor layer is located between the first gate electrode and the second gate electrode,
wherein the source electrode is in contact with a top surface and a first, second, and third side surfaces of the oxide semiconductor layer,
wherein the third side surface of the oxide semiconductor layer is located between the first and second side surfaces of the oxide semiconductor layer,
wherein a direction along the third side surface crosses a direction along the first side surface, and
wherein the second gate electrode extends beyond the oxide semiconductor layer along a channel width direction.

18. The semiconductor device according to claim 17, wherein the first gate electrode is electrically connected to one of the source electrode and the drain electrode.

19. The semiconductor device according to claim 17, wherein the oxide semiconductor layer is a crystalline oxide semiconductor layer.

20. The semiconductor device according to claim 17, wherein the oxide semiconductor layer comprises indium, gallium, and zinc.

21. The semiconductor device according to claim 17, wherein a thickness of the oxide semiconductor layer is greater than or equal to 0.1 μm and less than or equal to 50 μm.

22. The semiconductor device according to claim 17, wherein an off-state current per micrometer of a channel width of the transistor is 100 zA or less at room temperature.

23. The semiconductor device according to claim 17,
wherein a length of the oxide semiconductor layer is smaller than a length of the first gate electrode in a channel length direction, and
wherein a length of the oxide semiconductor layer is larger than a length of the second gate electrode in the channel length direction.

24. The semiconductor device according to claim 17,
wherein the second gate electrode comprises a first region and a second region opposed to the first region in the channel width direction,
wherein the first region of the second gate electrode is opposed to the first side surface of the oxide semiconductor layer with the second gate insulating layer interposed therebetween, and
wherein the second region of the second gate electrode is opposed to the second side surface of the oxide semiconductor layer with the second gate insulating layer interposed therebetween.

* * * * *